(12) United States Patent
Notsch

(10) Patent No.: US 10,256,729 B1
(45) Date of Patent: Apr. 9, 2019

(54) SWITCHED-CAPACITOR CONVERTER WITH INTERLEAVED HALF BRIDGE

(71) Applicant: Infineon Technologies Austria AG, Villach (AT)

(72) Inventor: Chris Josef Notsch, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/913,363

(22) Filed: Mar. 6, 2018

(51) Int. Cl.
*H02M 3/158* (2006.01)
*H02M 3/07* (2006.01)
*H02M 1/00* (2006.01)

(52) U.S. Cl.
CPC .......... *H02M 3/1584* (2013.01); *H02M 3/07* (2013.01); *H02M 3/1588* (2013.01); *H02M 2001/007* (2013.01); *H02M 2001/009* (2013.01); *H02M 2003/072* (2013.01); *H03K 2217/0063* (2013.01); *H03K 2217/0072* (2013.01)

(58) Field of Classification Search
CPC ............. H02M 3/07; H02M 2001/007; H02M 2003/072; H02M 2001/0083; H02M 2001/0064; H03K 2217/0063; H03K 2217/0072
See application file for complete search history.

(56) References Cited

U.S. PATENT DOCUMENTS

| | | | | |
|---|---|---|---|---|
| 6,574,125 B2* | 6/2003 | Matsukawa | ....... | H02M 3/33569 363/132 |
| 9,780,670 B2* | 10/2017 | Trevisan | ........... | H02M 3/33507 |
| 9,825,545 B2* | 11/2017 | Chen | ................. | H02M 3/33546 |
| 9,973,099 B2* | 5/2018 | Ye | ..................... | H02M 3/33576 |
| 2013/0016543 A1* | 1/2013 | Ku | .................... | H02M 7/53871 363/71 |
| 2014/0254224 A1* | 9/2014 | Feldtkeller | .......... | H02M 7/5387 363/127 |

(Continued)

OTHER PUBLICATIONS

Notsch, Chris, "Cascaded Voltage Converter with Inter-Stage Magnetic Power Coupling", U.S. Appl. No. 15/913,000, filed Mar. 6, 2018.

(Continued)

*Primary Examiner* — Yusef A Ahmed
(74) *Attorney, Agent, or Firm* — Murphy, Bilak & Homiller, PLLC

(57) ABSTRACT

Circuits and methods are provided for voltage conversion within a switched-capacitor converter (SCC). The SCC includes multiple switch stages cascaded together. Each switch stage includes two half bridges connected in parallel. Each half bridge has a high and low-side switch connected at a switching node. The switching nodes of each half bridge of each switch stage are coupled to corresponding switching nodes of some other switch stage via capacitors. The switches are controlled such that during a first interval, a phase A capacitor attached to each switch stage is charged while a phase B capacitor is discharged. During a second interval, the phase B capacitor is charged while the phase A capacitor is discharged. By alternating the intervals thusly, one of the capacitors coupled to each switch stage is nearly always discharging such that it can provide current to an output of the SCC or some adjacent switch stage.

18 Claims, 11 Drawing Sheets

(56) References Cited

U.S. PATENT DOCUMENTS

| | | | |
|---|---|---|---|
| 2014/0268903 A1* | 9/2014 | Reiter | H02M 3/3376 363/21.02 |
| 2015/0029761 A1* | 1/2015 | Trinh | H02M 1/36 363/17 |
| 2015/0131329 A1* | 5/2015 | Chen | H02M 1/08 363/17 |
| 2015/0162841 A1* | 6/2015 | Masuda | H02M 3/33584 363/17 |
| 2015/0180345 A1* | 6/2015 | Frost | H02M 3/3376 363/17 |
| 2015/0222193 A1* | 8/2015 | Zambetti | H02M 3/33546 363/21.02 |
| 2015/0295497 A1* | 10/2015 | Perreault | H02M 3/3376 363/21.03 |
| 2015/0349649 A1* | 12/2015 | Zane | H02M 3/33507 363/21.03 |
| 2016/0043624 A1* | 2/2016 | Jarvinen | H02M 1/084 323/271 |
| 2016/0072393 A1* | 3/2016 | McIntyre | G01R 19/00 363/21.1 |
| 2016/0190943 A1* | 6/2016 | Chen | H02M 3/335 363/21.06 |
| 2016/0336873 A1* | 11/2016 | Ayai | H02M 3/33576 |
| 2017/0085176 A1* | 3/2017 | Mathe | H02M 3/1584 |
| 2017/0085183 A1* | 3/2017 | Notsch | H02M 3/33507 |
| 2017/0085189 A1* | 3/2017 | Madsen | H02M 3/33546 |
| 2017/0288555 A1* | 10/2017 | Trevisan | H02M 3/33523 |
| 2018/0062522 A1* | 3/2018 | Popovici | H02M 3/33569 |
| 2018/0115250 A1* | 4/2018 | Ng | H02M 3/33546 |

OTHER PUBLICATIONS

Rainer, Christian, "Switched Capacitor Converter with Compensation Inductor", U.S. Appl. No. 15/848,782, filed Dec. 20, 2017.

* cited by examiner

SWITCHED-CAPACITOR CONVERTER WITH INTERLEAVED HALF BRIDGE

TECHNICAL FIELD

The present application relates to a switched-capacitor converter which includes multiple switch stages cascaded together, wherein each of the switch stages has at least two interleaved half bridges.

BACKGROUND

Switching direct current (DC) to DC voltage converters are used in a variety of applications for converting power at an input voltage into power at a desired output voltage. Such voltage converters are used to power loads such as battery chargers, computers, televisions, and many other electronic devices.

A voltage converter may step down or step up an input voltage by a fixed conversion factor (e.g., 2:1, 4:1, 1:3) for applications in which the voltage converter's load does not require regulation. Switched-capacitor converters (SCCs) represent a class of voltage converters that may convert voltages based upon such a fixed conversion factor. SCCs operate with low impedance and high efficiency, at least as compared with many other voltage converter types including typical regulated voltage converters. SCCs do not require bulky magnetics (e.g., inductors or transformers), leading to potentially high power density for SCCs. Furthermore, the switch control for SCCs is fairly simple, especially when compared with regulated voltage converters, and does not require measurement sensors as typically needed by controllers for regulated voltage converters.

A typical SCC operates by using switches to transfer energy among several link capacitors. The switches and link capacitors may be partitioned into first and second groups, and a switching cycle of the SCC may be partitioned into first and second phase intervals. During the first phase of a switching interval, the first group of switches conduct such that charge is transferred to the first group of capacitors from the input or from the second group of capacitors. During the second phase of the switching interval, the second group of switches conduct, such that charge (energy) is transferred from the first group of capacitors to the second group of capacitors and to the output and its associated output capacitor. Power flows from the input to the output of the SCC via these energy transfers between the first and second groups of capacitors that occur during the first and second phases of a switching interval.

An SCC's link capacitors must be sized such that they can store the charge that is provided within the first and second phases of the switching interval, with minimal losses during the charge transfers. Furthermore, the output capacitor must be sized such that any voltage ripple at the SCC output is within an acceptable range. These requirements lead to capacitors having fairly high capacitances, and associated large sizes, such that the capacitors comprise a significant portion of the area (and volume) consumed by an SCC.

Circuit topologies and associated techniques that reduce the size of capacitors within SCCs are desired.

SUMMARY

According to an embodiment of a switched-capacitor converter (SCC), the SCC comprises an input, an output, at least two switch stages cascaded together, first and second capacitors, and a controller. At least a first and a second of the switch stages each include first and second half bridges. Each first half bridge includes a first high-side switch coupled to a first low-side switch at a first switching node. Each second half bridge includes a second high-side switch coupled to a second low-side switch at a second switching node. The first and second half bridges are connected to each other in parallel. The first capacitor couples the first switching node of the first switch stage to the first switching node of the second switch stage, whereas the second capacitor couples the second switching node of the first switch stage to the second switching node of the second switch stage. The controller is configured to generate first and second switch control signals. The first switch control signal controls the first high-side switch of each of the switch stages, whereas the second switch control signal controls the second high-side switch of each of the switch stages.

According to an embodiment of an electrical system, the electrical system comprises a switched-capacitor converter (SCC) as described above. The electrical system further comprises a load which is electrically coupled to the output and is powered by the SCC.

According to an embodiment of a method, voltage is converted within a switched capacitor converter (SCC) such as that described above. The method begins with a step of turning on the first high-side switches and the second low-side switches of the each of the switch stages for a first conduction interval, so as to charge the first capacitor and discharge the second capacitor. Next, the switches are turned off for a first dead-time interval. This is followed by a step of turning on the first low-side switches and the second high-side switches of the each of the switch stages for a second conduction interval, so as to charge the second capacitor and discharge the first capacitor. Next, the switches are turned off for a second dead-time interval. These steps are repeated as needed to convert an input voltage into an output voltage.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments may be combined unless they exclude each other. Embodiments are depicted in the drawings and are detailed in the description that follows.

DETAILED DESCRIPTION

Figure 1:
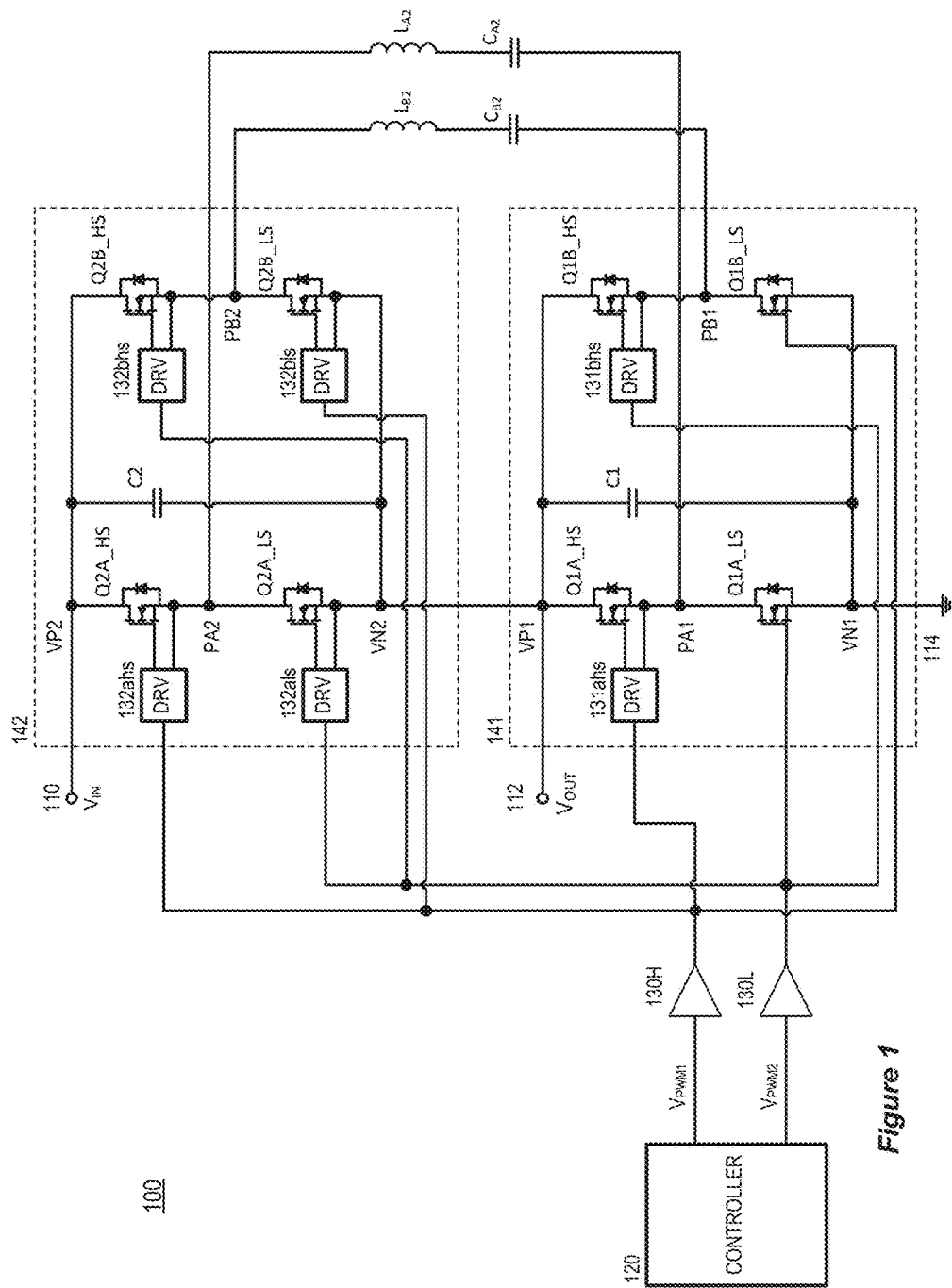
FIG. 1 illustrates a schematic diagram of a switched-capacitor converter with two switch stages, wherein each switch stage includes two half bridges.

The embodiments described herein provide circuits and methods for stepping an input voltage up or down according to a fixed conversion ratio. The described circuit topologies employ a cascaded arrangement of at least two switch stages, wherein at least one of the switch stages is coupled to an input and at least one of the switch stages is coupled to an output. The switches within each of the switch stages are switched so as to transfer power through the converter, using linking capacitors, such that the voltage at the output is stepped up or stepped down relative to the input voltage. Unlike standard switched-capacitor converters (SCCs), the circuits and techniques described below use more than one half bridge within each switch stage, and interleaved control of switches within these half bridges, to transfer power from the input and to the output. The interleaved control of the half bridge switches enables such power transfer to occur throughout each switching cycle of the converter, rather than during just a portion (phase interval) of each switching cycle. This allows for smoother voltages (less ripple) at the output and at intermediate nodes, while using smaller capacitors than might be required in a standard SCC.

The circuit topologies described herein provide variations of SCCs. Standard step-down SCCs include one or more input switch stages cascaded with an output switch stage. Each input switch stage typically includes two switches, which may be denoted as a high-side and a low-side switch, and which are serially connected at a switching node. The high-side and low-side switches are alternately turned on. A first group of capacitors, sometimes termed link capacitors, couples the switching nodes of the input switch stages to a switching node of the output switch stage. A second group of capacitors may be coupled across each input switch stage, or may couple inter-switch-stage nodes to another switching node of the output switch stage. The switching of the SCC is performed with a switching frequency, which has an associated switch period. A switching cycle occurring within each switch period may be partitioned into a first phase interval, during which the high-side switches conduct and the low-side switches are off, and a second phase interval, during which the low-side switches conduct and the high-side switches are off.

During the first phase interval, energy is transferred to the first group of capacitors from the input and from the second group of capacitors. During the second phase interval, energy is transferred from the first group of capacitors to the second group of capacitors and to the output and its associated capacitor. In such a typical SCC, energy is only transferred from the input during the first phase interval of each switching cycle. Consider a first switch stage, which is coupled to the input in a step-down SCC, and the capacitor coupling the first switch stage's switching node to the output stage. That capacitor must be sized such that it can store charge (energy) during the first phase interval, wherein that charge (energy) is adequate for ultimately supplying energy to the output over an entire switching cycle (period). The capacitance of the capacitor must be quite large due, in part, to the fact that power is only supplied from the input for approximately half of a switching cycle.

The above problem is addressed by the circuit topologies and techniques described herein, which transfer power from an input throughout nearly all of each switch cycle, rather than using only one phase interval (approximately half of each switch cycle). Considering a first switch stage, which is connected to the input in a step-down converter, this is accomplished by augmenting the high-side/low-side switch pair described above, and henceforth termed a first half bridge, with at least a second half bridge which is connected in parallel with the first half bridge. In general, two or more half bridges may be connected in parallel to form the first switch stage. The parallel-connected half bridges of the first switch stage are controlled in an interleaved manner, such that power is alternately input to the converter using the parallel-connected half bridges. More particularly, in the case of two parallel-connected half bridges, during a first phase interval, power is transferred from the input by turning on the high-side switch of the first half bridge, such that power flows from the input to a link capacitor of this first half bridge. During a second phase interval, power is transferred from the input by turning on the high-side switch of the second half bridge, such that power flows from the input to a link capacitor of the second half bridge. Except for a relatively short "dead time" interval separating the first and second phase intervals, the switches nearly always allow for power conduction from the input.

While the above description focuses on a switch stage connected to an input in a step-down converter, other switch stages function similarly except that they are transferring power from an upstream switch stage, rather than directly from the input. Furthermore, the circuit topologies described herein also support step-up voltage conversion, wherein such operation merely involves swapping the input and output terminal connections.

The embodiments are described below by way of particular examples of switched-capacitor converters (SCCs). These examples have the common feature that they include multiple switch stages connected in a cascade arrangement. Furthermore, at least some of these switch stages comprise two or more half bridges connected in parallel, and which are operated in an interleaved manner, so as to transfer power through a given switch stage throughout substantially all of a switching cycle of the SCC. It should be understood that the below examples are not meant to be limiting. Circuits and techniques that are well-known in the art are not described in detail, so as to avoid obscuring unique aspects of the invention. Features and aspects from the example embodiments may be combined or re-arranged, except where the context does not allow this.

The description continues below with an embodiment of an SCC having two cascaded switch stages, wherein the SCC is operated in a step-down mode. The circuit topology of such a circuit is described, followed by an operational description based upon current loops and waveforms within the SCC. This SCC is extrapolated to three stages, and power loops within such an SCC are described. Next, it is explained how the SCC may be operated in a step-up mode. This is followed by techniques that may be used within the SCC to reduce power losses during low-power operation of the SCC. Circuit topologies that augment the electrical power transfer among switch stages with magnetic power transfer are also described. Then, an SCC employing four switch stages is described, followed by a method for operating an SCC using interleaved control of half bridges.

Two-Stage Switched-Capacitor Converter Having Interleaved Half Bridges

FIG. 1 illustrates an embodiment of a switched-capacitor converter (SCC) 100 having first and second switch stages 141, 142 connected in a cascade arrangement. Each of these switch stages 141, 142 includes two half-bridge circuits connected in parallel. In general, each of the switch stages 141, 142 may include two or more half bridges connected in parallel. A controller 120 generates switch control signals $V_{PWM1}$, $V_{PWM2}$, which control, via switch drivers, switches within the switch stages 141, 142. In addition to a direct electrical connection (VP1 to VN2) between the switch stages 141, 142, phase A switching nodes PA2, PA1 and phase B switching nodes PB2, PB1 of the switch stages 142, 141 are coupled together using link capacitors $C_{B2}$, $C_{A2}$ and inductances $L_{B2}$, $L_{A2}$. The inductances $L_{B2}$, $L_{A2}$ may be parasitic (e.g., wiring/trace) inductances of the circuit or physical inductors. First, second, and ground terminals 110, 112, 114 provide external electrical contact points for the SCC 100.

The description below focuses on a 2:1 step-down operational mode for the SCC 100, in which the first terminal 110 is supplied with a relatively high voltage $V_{IN}$ that is stepped down by a factor of two to provide a lower voltage $V_{OUT}$ at the second terminal 112. In such an operational mode, the first terminal 110 serves as an input for connecting to a power source, and the second terminal 112 serves as an output for supplying power to a load (not shown) of the SCC 100. As will be explained further below, the SCC 100 may alternatively be operated in a step-up mode, in which the second terminal 112 serves as an input and the first terminal 110 serves an output.

Each of the switch stages 141, 142 includes two half bridge circuits, henceforth termed a phase-A half bridge and a phase-B half bridge. The half bridges of each switch stage are connected in parallel, as shown. Each of the half bridges includes two power switches connected in series at a switching node. The second switch stage 142 is taken as representative of the switch stages 141, 142, and is described in further detail below.

The second switch stage 142 includes a phase A half bridge having a high-side switch Q2A_HS and a low-side switch Q2A_LS connected in series at a phase A switching node PA2. The second switch stage 142 further includes a phase B half bridge having high-side and low-side switches Q2B_HS, Q2B_LS connected in series at a phase B switching node PB2. The phase A and phase B half bridges are each connected between positive and negative nodes (terminals) VP2, VN2 of the second switch stage 142, i.e., the half bridges are connected in parallel. A switch-stage capacitor C2 is also connected across the terminals VP2, VN2 of the second switch stage. Due to the interleaved control of the parallel half bridges, the switch-stage capacitor C2 does not need to store significant amounts of charge, as may be required in typical SCCs. This means the capacitor C2 may have a relatively small capacitance, e.g., 200 nF, whereas corresponding capacitors in typical SCCs that do not use the circuits and techniques described herein may require that C2 have a capacitance on the order of 20-200 µF. Using the techniques herein, the capacitor C2 may even be omitted entirely for some applications, as illustrated in other circuits herein, e.g., in FIGS. 3A and 3B.

As illustrated, the positive terminal VP2 of the second switch stage 142 is coupled to the first terminal 110 of the SCC 100. In alternative embodiments having more than two switch stages, this positive terminal VP2 may be used to connect to a further switch stage at that further switch stage's negative terminal VN. The negative terminal VN2 of the second switch stage 142 is coupled to the first switch stage 141 at its positive terminal VP1.

The switches Q2A_HS, Q2A_LS, Q2B_HS, Q2B_LS of the half bridges each have first, second, and control terminals (e.g., drain, source, and gate). When an appropriate active (e.g., high) signal is applied to a switch's control terminal, conduction is enabled between that switch's first and second terminals. In such a conducting (on) state, the voltage across the first and second terminals of the switch is approximately zero. Conversely, a non-conducting (off) switch provides an open circuit from its first to its second terminals.

The first switch stage 141 is configured and includes components substantially the same as the second switch stage 142, except that the first switch stage 141 has external connections 112, 114 different from those of the first switch stage 141, as shown in FIG. 1.

The switches within the illustrated SCC 100 of FIG. 1 are power metal-oxide semiconductor field-effect transistors (MOSFETs), but other switch types may be used. For example, junction field-effect transistors (JFETs), bipolar junction transistors (BJTs), insulated gate bipolar transistors (IGBTs), high electron mobility transistors (HEMTs), or other types of power transistors may be preferred in some applications. The switches may be integrated on the same semiconductor die, may each be provided on separate dies, or may otherwise be spread across a plurality of semiconductor dies. Each of the MOSFET switches within the SCC 100 has drain (first) and source (second) terminals, as well as a gate terminal that controls conduction between the drain and source.

The switches within a given switch stage are operated such that, for a first conduction interval of a switching cycle, the high-side switch of the phase A half bridge conducts at the same time as the low-side switch of the phase B half bridge. During this first conduction interval, the other switches are turned off (not conducting). Such an interval is followed by a second conduction interval of the same switching cycle, during which the low-side switch of the phase A half bridge and the high-side switch of the phase B half bridge conduct. During the second conduction interval, the other switches are turned off (not conducting). The first and second conduction intervals may be separated by relatively brief dead time intervals, during which no switches are conducting. Conduction of the switches is controlled by control signals generated by the controller 120.

The controller 120 generates a first pulse-width-modulated (PWM) signal $V_{PWM1}$, which controls conduction of the switches Q2A_HS, Q1A_HS, Q2B_LS, Q1B_LS, and generates a second PWM signal $V_{PWM2}$, which controls the switches Q2A_LS, Q1A_LS, Q2B_HS, Q1B_HS. While the SCC 100 of FIG. 1 includes only two switch stages 141, 142, other embodiments may have more switch stages, in which case the first and second PWM signals $V_{PWM1}$, $V_{PWM2}$ may also control corresponding switches within such other switch stages. The generated PWM signals $V_{PWM\_Q1}$, $V_{PWM\_Q2}$ have alternating active pulses such that, e.g., the phase A high-side switch Q2A_HS is set to conduct while the phase A low-side switch Q2A_LS is off during the first conduction interval, followed by a second conduction interval during which the phase A low-side switch Q2A_LS is set to conduct while the phase A high-side switch Q2A_HS is turned off. The PWM signals $V_{PWM1}$, $V_{PWM2}$ are generated such that the high and low-side switches Q2A_HS, Q2A_LS are not turned on (conducting) at the same time. The first and second conduction intervals of each switching cycle are separated by "dead time" intervals during which neither of the high and low-side switches Q2A_HS, Q2A_LS conducts. The generated PWM signals $V_{PWM\_Q1}$, $V_{PWM\_Q2}$ control the switches Q2B_HS, Q2B_LS of the phase B half bridge in an opposite manner. While explained above in the context of the second switch stage 142, the PWM signals $V_{PWM\_Q1}$, $V_{PWM\_Q2}$ similarly control switches within the first switch stage 141 and any other switch stages of an SCC.

The controller 120 and its constituent parts may be implemented using a combination of analog hardware components (such as transistors, amplifiers, diodes, and resistors), and processor circuitry that includes primarily digital components. The processor circuitry may include one or more of a digital signal processor (DSP), a general-purpose processor, and an application-specific integrated circuit (ASIC). The controller 120 may also include memory, e.g., non-volatile memory such as flash, that includes instructions or data for use by the processor circuitry, and one or more timers, e.g., for generating the first and second conduction intervals according to a switching frequency, and dead time intervals. Because the SCC 100 operates using a fixed down or up conversion ratio, the controller 120 may be less complex than controllers that require adaptive, closed-loop control based upon the sensing of feedback signals, as is typical of most regulated voltage converters.

The PWM signals $V_{PWM1}$, $V_{PWM2}$ generated by the controller 120 are fed to (active) driver circuits 130L, 130H, which, in turn, feed bootstrap driver circuits 131ahs, 131bhs, 132als, 132bls, 132ahs, 132bhs. All of the drivers output PWM control signals having appropriate voltage levels to drive control terminals (e.g., gates) of each of the switches within the SCC 100. As illustrated, the driver circuits 130L, 130H, 131ahs, 131bhs, 132als, 132bls, 132ahs, 132bhs provide output control signals referenced, respectively, to source voltages of their respective MOSFET switches within the SCC 100. For example, the gate-to-source voltage provided to each of the switches Q1A_LS, Q1B_LS may alternate between 0V and 5V.

So as to limit the number of active driver circuits, the illustrated embodiment uses bootstrap switch driver circuits 131ahs, 131bhs, 132als, 132bls, 132ahs, 132bhs for most of the switches. The driver circuits 130L, 130H are direct/active drivers that may provide a necessary voltage level shifting or drive current. As illustrated, these drivers 130L, 130H are coupled to the control terminals (e.g., gates) for the switches Q1A_LS and Q1B_LS, whose source terminals are tied to ground. Hence, the drivers 130L, 130H may be ground referenced. The driver circuits 130L, 130H also provide control signals that are input to each of the bootstrap switch driver circuits 131ahs, 131bhs, 132als, 132bls, 132ahs, 132bhs.

Figure 2:
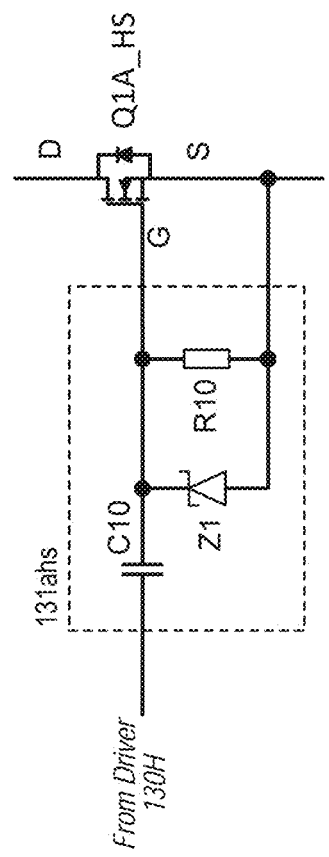
FIG. 2 illustrates circuitry corresponding to bootstrap switch drivers, as included in FIG. 1.

FIG. 2 illustrates circuitry within the bootstrap driver 131ahs, which is taken as representative of the bootstrap driver circuits. The bootstrap switch driver 131ahs uses a linking capacitor C10 to couple the signal output from the driver circuit 130H to the control terminal (gate) of switch Q1A_HS. The bootstrap switch driver 131ahs also includes a Schottky diode Z1 and a resistor R10, which serve to clamp and equalize the voltage at the control terminal (gate) of the switch Q1A_HS, so that the control terminal voltage remains within a desired range. The other bootstrap driver circuits are similarly configured. Note that other driver circuits, e.g., standard (active) level-shifting drivers, may be used in place of the bootstrap switch drivers 131ahs, 131bhs, 132als, 132bls, 132ahs, 132bhs.

A link capacitor $C_A Z$ couples the phase A switching nodes PA1, PA2 of the first and second switch stages 141, 142. A link capacitor $C_{B2}$ similarly couples the phase B switching nodes PB1, PB2 of the switch stages 141, 142. The SCC 100 also shows inductances $L_{A2}$, $L_{B2}$ in series with, respectively, the link capacitors $C_{A2}$, $C_{B2}$. The inductances $L_{A2}$, $L_{B2}$ may be physical inductors (components), or may merely represent the parasitic inductance of the electrical connections (e.g., circuit board or semiconductor wiring/traces) coupling a link capacitor, such as $C_A$, to its corresponding switching nodes, such as PA1, PA2. In preferred embodiments, these inductances $L_{A2}$, $L_{B2}$ represent the parasitic inductances of wiring/traces and the link capacitors $C_{A2}$, $C_{B2}$, and form resonant tanks in conjunction with the link capacitors $C_{A2}$, $C_{B2}$. Capacitances for the link capacitors $C_{A2}$, $C_{B2}$ are determined such that the switching frequency $F_{SW}$ of the SCC 100 matches (or nearly matches) a resonant frequency of the resonant tanks formed by $C_{A2}$ and $L_{A2}$, and by $C_{B2}$ and $L_{B2}$. This, in turn, leads to zero-current switching (ZCS), or near ZCS, of the switches within the SCC 100, and minimizes power losses associated with the switching. Capacitances and inductances for the resonant tanks, and associated ZCS functionality, are discussed further in conjunction with FIG. 8A.

In some embodiments, the inductances $L_{A2}$, $L_{B2}$ may be inductor components. For such embodiments, ZCS for a given switch frequency $F_{SW}$ may be achieved using smaller capacitors than in the preferred embodiment described above. In yet other embodiments, the inductances $L_{A2}$, $L_{B2}$ may be omitted and/or ZCS operation forgone, in which case smaller capacitances, and smaller link capacitors, may be used, provided that the energy storage capacity of the capacitors is sufficient to support the necessary power transfer.

Voltage and Current Waveforms within the Two-Stage Step-Down SCC

Figure 3:
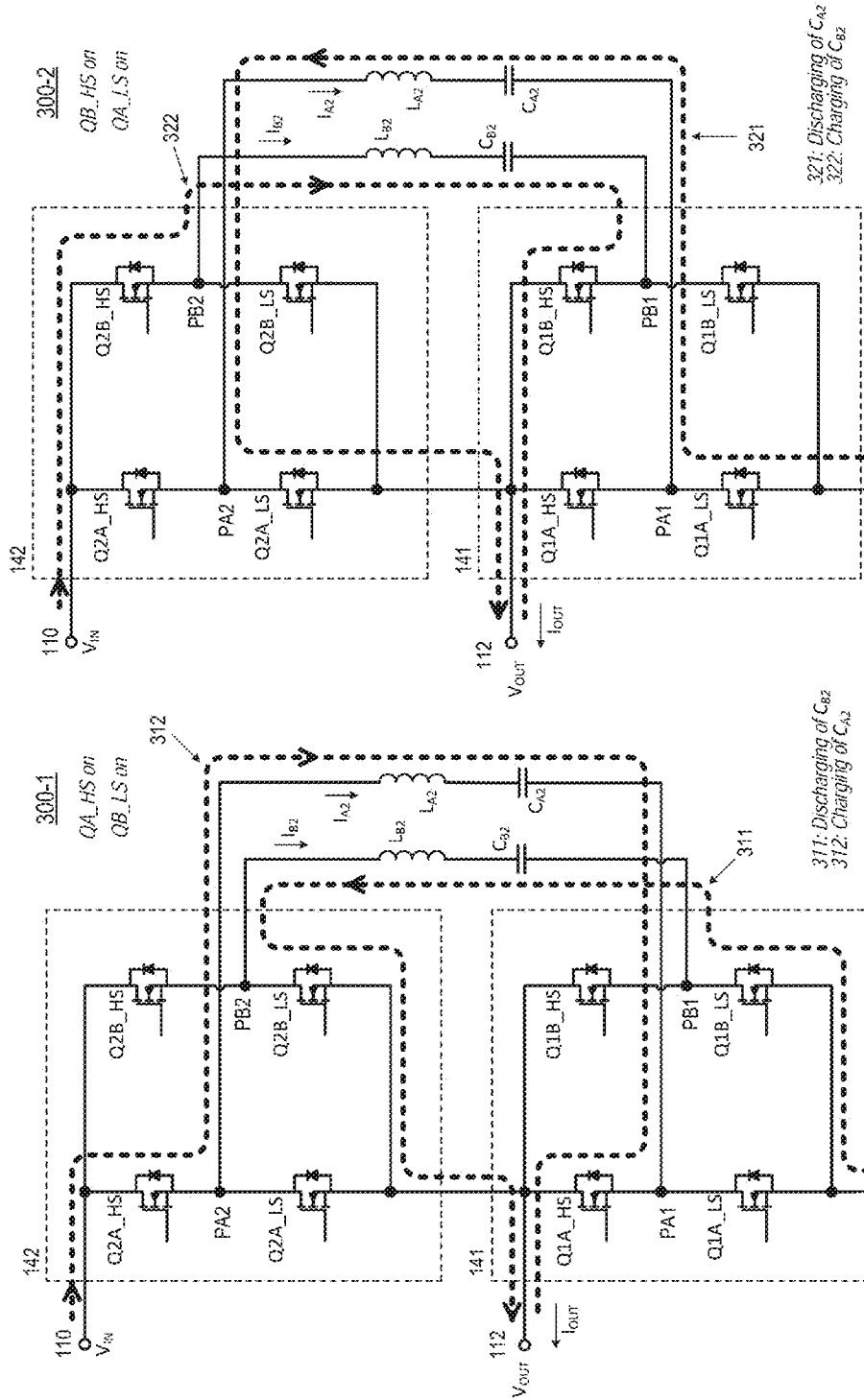
FIGS. 3A and 3B illustrate power loops within switch stages of a switched-capacitor converter such as that shown in FIG. 1 for, respectively, first and second conduction intervals.

The operation of the SCC 100 will now be described using the power loops shown in FIGS. 3A and 3B, and associated voltage and current waveforms shown in FIG. 4. FIGS. 3A and 3B illustrate circuits 300-1, 300-2 corresponding to the SCC 100 of FIG. 1, except that the capacitors C1 and C2 are deleted in these circuits 300-1, 300-2. For ease of illustration, several other components of the SCC 100, e.g., the controller, drivers, are not illustrated in FIGS. 3A and 3B, but are understood to actually be included in the circuits 300-1, 300-2 and are as described for the SCC 100 of FIG. 1.

FIG. 3A illustrates power loops 312, 311 for the first conduction interval of a switching cycle. As described previously, the controller 120 sets the high-side switches Q2A_HS, Q1A_HS of the switch stages 142, 141 to conduct during this first conduction interval of the switching cycle. The power loop 312 shows that current flows from the first terminal 110 (which is coupled to an input power supply $V_{IN}$ and through the high-side switch Q2A_HS, thereby charging the link capacitor $C_{A2}$. The other (low-voltage) terminal (plate) of the link capacitor $C_{A2}$ is tied to the second terminal 112 (output voltage $V_{OUT}$), via the high-side switch Q1A_HS, thereby pegging the voltage at that capacitor terminal to $V_{OUT}$. (The output voltage $V_{OUT}$ has an expected DC value of $V_{IN}/2$.) A charging current $I_{A2}$ flowing to the link capacitor $C_{A2}$ takes on the shape of a half-sinusoid, due to the resonant tank formed by the inductance $L_{A2}$ and capacitor $C_{A2}$.

The power loop 311 shows that current ($-I_{B2}$) flows to the second (output) terminal 112, via the low-side switch Q2B_LS, thereby discharging the link capacitor $C_{B2}$. The other (low-voltage) terminal (plate) of the link capacitor $C_{B2}$ is tied to the ground 114, via the low-side switch Q1B_LS, during the first conduction interval of the switching cycle. The discharge current $-I_{B2}$ flowing from the link capacitor $C_{B2}$ takes on the shape of a half-sinusoid, due to the resonant tank formed by the inductance $L_{B2}$ and capacitor $C_{B2}$.

FIG. 3B illustrates power loops 322, 321 for the second conduction interval of the same switching cycle. The operation is reversed relative to that described above. The phase B high-side switches Q2B_HS, Q1B_HS and the phase A low-side switches Q1B_LS, Q1A_LS are turned on. The power loop 322 shows that current $I_{B2}$ flowing from the first terminal 110 ($V_{IN}$), via the high-side switch Q2B_HS, charges the link capacitor $C_{B2}$. The other (low-voltage) terminal (plate) of the link capacitor $C_{B2}$ is tied to the second terminal 112 ($V_{OUT}$), via the high-side switch Q1B_HS, thereby pegging the voltage at that capacitor terminal to $V_{OUT}$ ($V_{IN}/2$).

The power loop 321 shows that current ($-I_{A2}$) flows to the second (output) terminal 112, via the low-side switch Q2A_LS, thereby discharging the link capacitor $C_{A2}$. The other (low-voltage) terminal (plate) of the link capacitor $C_{A2}$ is tied to the ground 114, via the low-side switch Q1A_LS, during the second conduction interval of the switching cycle. The charging $I_{B2}$ and discharging currents ($-I_{A2}$) each take on the shape of a half-sinusoid, albeit with different polarities.

Figure 4:
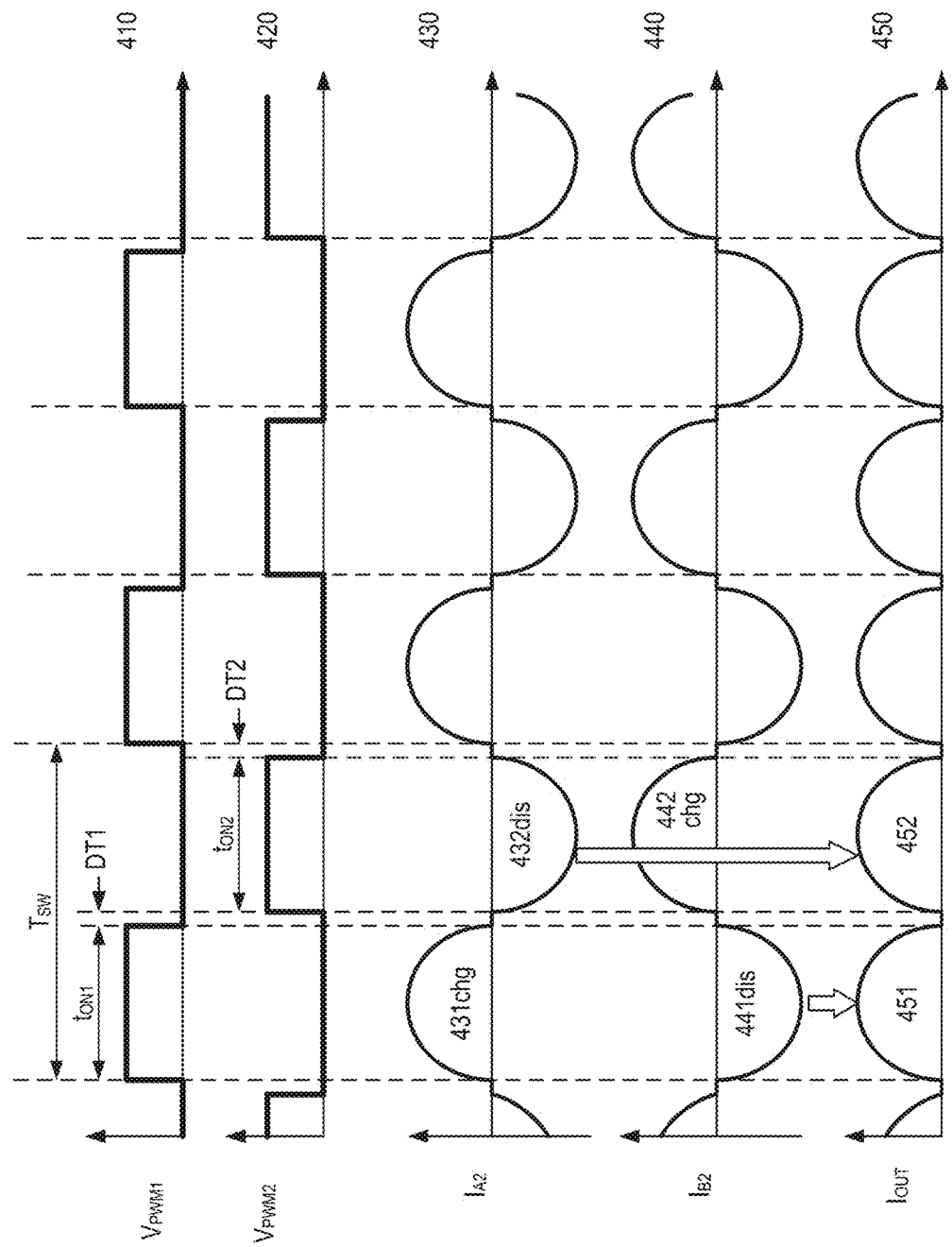
FIG. 4 illustrates voltage and current waveforms within a switched-capacitor converter such as that shown in FIG. 1.

FIG. 4 illustrates waveforms corresponding to switch control signals and currents during operation of the SCC 100. As illustrated in FIGS. 3A and 3B, the link capacitor currents $I_{A2}$, $I_{B2}$ are defined in the direction from the second-stage switching nodes PA2, PB2 to the first-switch stage switching nodes PA1, PB2. For the step-down SCC operation described, these currents $I_{A2}$, $I_{B2}$ are positive when the link capacitors $C_{A2}$, $C_{B2}$ are charged, and are negative when the link capacitors $C_{A2}$, $C_{B2}$ are discharged.

Voltage waveforms 410, 420 corresponding to the switch control signals $V_{PWM1}$, $V_{PWM2}$ are illustrated in FIG. 4. These signals are generated with a switching frequency $F_{SW}$ having a corresponding switch period $T_{SW}$, which sets the duration of each switching cycle of the SCC 100. The switch period $T_{SW}$ is partitioned into a first conduction interval $t_{ON1}$, a first dead-time interval DT1, a second conduction interval $t_{ON2}$, and a second dead-time interval DT2. During the first conduction interval $t_{ON1}$, the first switch control signal $V_{PWM1}$ is high (active), thereby setting the phase A high-side switches Q2A_HS, Q1A_HS to conduct, as shown in the power loop 312 of FIG. 3A. Additionally, the phase B low-side switches Q2B_LS, Q1B_LS are set to conduct, as shown in the power loop 311 of FIG. 3A. At the end of the first conduction interval $t_{ON1}$, the first control signal $V_{PWM1}$, transitions to a low level, thereby turning off these switches. All of the switches are held off for the DT1 interval.

This is followed by the second conduction interval $t_{ON2}$ for the same switch period $T_{SW}$, during which the second switch control signal $V_{PWM2}$ is high (active). The phase B high-side switches Q2B_HS, Q1B_HS are set to conduct, as shown in the power loop 322 of FIG. 3B. Additionally, the phase A low-side switches Q2A_LS, Q1A_LS are set to conduct, as shown in the power loop 321 of FIG. 3B. At the end of the second conduction interval $t_{ON2}$, the second control signal $V_{PWM2}$ transitions to a low level, thereby turning off these switches. All of the switches are held off for the DT2 interval.

The above switching sequence is repeated for each switching cycle, each of which has the switch period $T_{SW}$, while the SCC is operational. FIG. 4 illustrates three such switching cycles.

A waveform 430 corresponding to the current $I_{A2}$ flowing into the link capacitor $C_{A2}$ is illustrated in FIG. 4. During the first conduction interval $t_{ON1}$, such current $I_{A2}$ is positive, meaning that the link capacitor $C_{A2}$ is charged. The link capacitance $C_{A2}$ and inductance $L_{A2}$ form a resonant tank having a resonant frequency $F_{RES}$. Neglecting the relatively small dead times, if the resonant frequency $F_{RES}$ matches the switch frequency $F_{SW}$ of the SCC 100, the current $I_{A2}$ takes on the shape of a half cycle of a sinusoid during the first conduction interval $t_{ON1}$. Such a sinusoidally-shaped half cycle 431chg for the charging current $I_{A2}$ is illustrated.

During the second conduction interval $t_{ON2}$, the current $I_{A2}$ is negative, meaning that the link capacitor $C_{A2}$ is discharged. The discharge current $I_{A2}$ also takes on the shape of a sinusoidal half cycle 432dis, albeit in the negative direction. Positive discharge current flows out of the link capacitor $C_{A2}$ and to the second terminal 112 ($V_{OUT}$) during the second conduction interval $t_{ON2}$.

A waveform 440 illustrates the current $I_{B2}$ flowing into the link capacitor $C_{B2}$. Positive current $I_{B2}$ flows into (charges) the link capacitor $C_{B2}$ during the second conduction interval $t_{ON2}$, and flows from (discharges) the link capacitor $C_{B2}$ during the first conduction interval $t_{ON1}$. Power loop 321 from FIG. 3B and power loop 311 from FIG. 3A correspond, respectively, to the charging (442chg) and discharging (441dis) of the link capacitor $C_{B2}$.

The discharge intervals (e.g., 441dis, 432dis) for each of the link capacitors $C_{A2}$, $C_{B2}$ provide an output current $I_{OUT}$ for the SCC 100, as shown in the output current waveform 450. For example, the discharge current $I_{B2}$ during the first conduction interval $t_{ON1}$, denoted as 441dis, flows directly to the second terminal 112 (output) leading to the half-cycle sinusoidally shaped output current 451. Similarly, the discharge current $I_{A2}$ during the second conduction interval $t_{ON2}$, denoted as 432dis, flows to the second terminal 112, resulting in the illustrated output current 452.

Because the discharge intervals (441dis, 432dis, etc.) alternate in this manner, current is provided continuously to the output, except for the small dead time intervals. For an SCC that does not have interleaved half bridges as described herein, current is typically only provided to the output for approximately half of each switching cycle. The circuits and techniques described herein provide several advantages. For a given switch frequency $F_{SW}$, a bulk capacitor that filters the output voltage $V_{OUT}$ may be reduced, since current is provided throughout most of each switch cycle $T_{SW}$. The link capacitors may be sized smaller than corresponding link capacitors in other SCC circuits, as smaller energy packets (charges) need to be transferred during each switching cycle (having the switch period $T_{SW}$) for the circuits and techniques described herein.

Power Loop for a Three-Stage SCC with Interleaved Half Bridges

Figure 10:
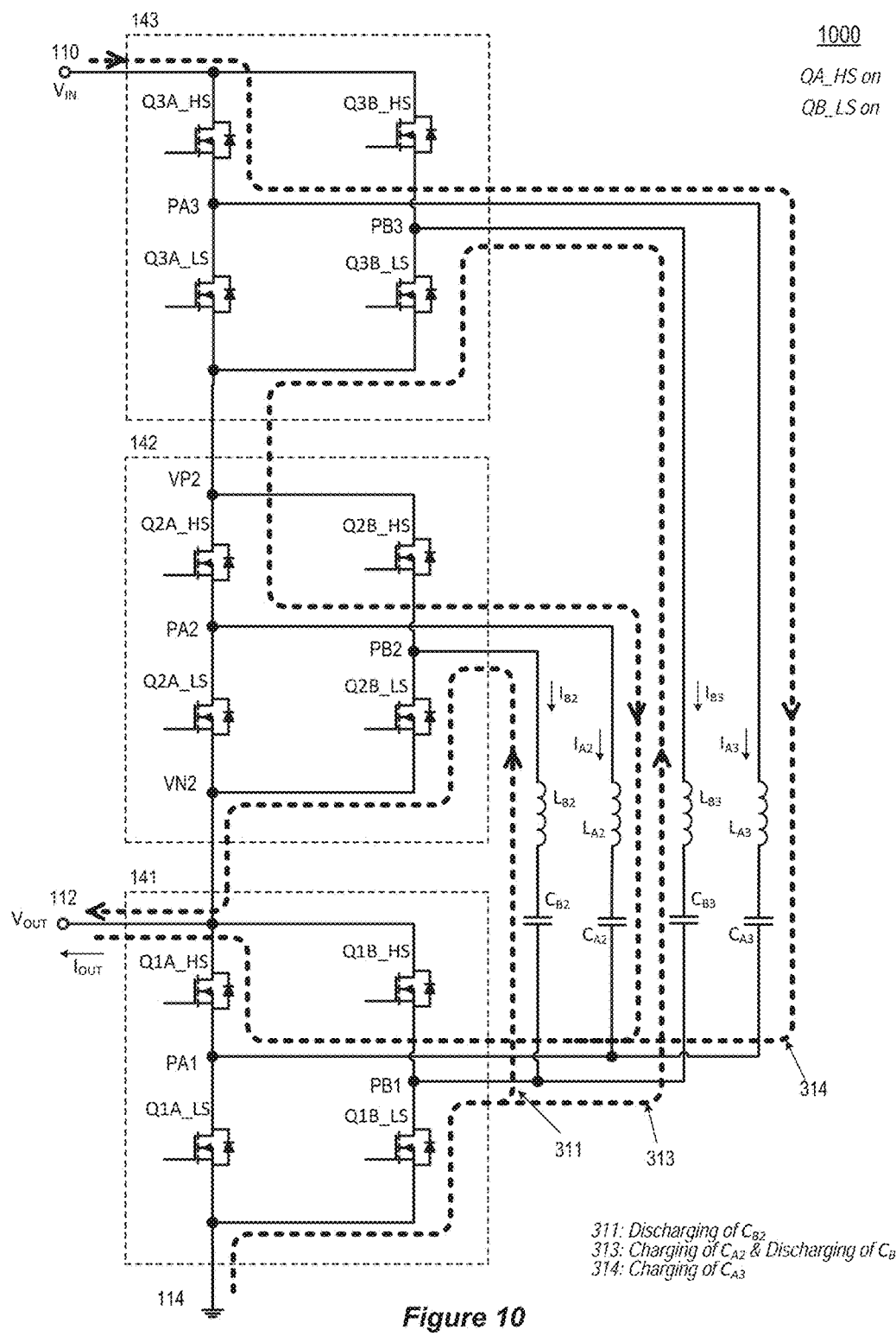
FIG. 10 illustrates power loops within a three-stage switched-capacitor converter that includes interleaved half bridges.

FIG. 10 illustrates power loops corresponding to a first conduction interval $t_{ON1}$ for an SCC similar to the SCC 300-1 of FIG. 3A, but having three switch stages rather than two. Because the circuitry and power loops of the SCC 1000 illustrated in FIG. 10 are similar to that of the SCC 300-1 and power loops described in relation to FIG. 3A, only those aspects that are different are described in detail below.

The SCC 1000 of FIG. 10 includes a third switch stage 143, which is configured largely the same as the first and second switch stages 141, 142 described previously. This third switch stage 143 is coupled to the first terminal 110, which is serving as an input. The input VP2 to the second switch stage 142 is provided by the third switch stage 143.

Three power loops 311, 313, 314 are illustrated in FIG. 10. These power loops correspond to a first conduction interval tom, in which the high-side switches Q3A_HS, Q2A_HS, Q1A_HS of the first half bridges and the low-side switches Q3A_LS, Q2A_LS, Q1A_LS of the second half bridges are set to conduct. Power loops corresponding to the second conduction $t_{ON2}$ are not illustrated.

The power loop 311 is largely the same as that illustrated in FIG. 3A. Like the power loop 312 of FIG. 3A, the power loop 313 of FIG. 10 charges the link capacitor $C_{A2}$. Unlike the power loop 312 of FIG. 3A, the current $I_{A2}$ used to charge the link capacitor $C_{A2}$ comes from discharging (via $-I_{B3}$) a link capacitor $C_{B3}$. (The power loop 312 of FIG. 3A charged the link capacitor $C_{A2}$ from the first terminal 110, which serves as the SCC input.) The power loop 314 charges the link capacitor $C_{A3}$ from the first terminal 110, which is serving as an input to the SCC 1000.

Note that the sum of the currents flowing into and out of each the switch stages is zero, or substantially zero, within each of the first and second conduction intervals $t_{ON1}$, $t_{ON2}$. Taking the second switch stage 142 of FIG. 10 as representative, the current flowing into this stage, i.e., the current $(-I_{B3})$ that flows to VP2 from the third switch stage 143, is the same as the current flowing out of this stage, i.e., the current $(-I_{B2})$ that flows from VN2 to the third switch stage 143, during the first switch stage interval $t_{ON1}$. This net current of zero means that the switch stage does not need a large capacitor, such as a capacitor connected as C2 of FIG. 1, that is capable of storing substantial charge (energy). As previously described, this means that the switch capacitor C2, as illustrated in FIG. 1, may have a very small capacitance or may be eliminated entirely. This represents a significant advantage over typical SCCs, which require the inclusion of such a capacitor, or similarly-functioning flying capacitors, for storing substantial charge (energy) within each conduction interval (approximately half of a switching cycle).

An output capacitor, e.g., a capacitor connected to the second terminal 112, may still be necessary for smoothing the output voltage. Using the techniques described herein, however, the capacitance of such an output capacitor may also be significantly reduced, since current is being supplied to the output throughout most of a switching cycle.

Step-Down and Step-Up Voltage Conversion

Figures 5A, 5B:
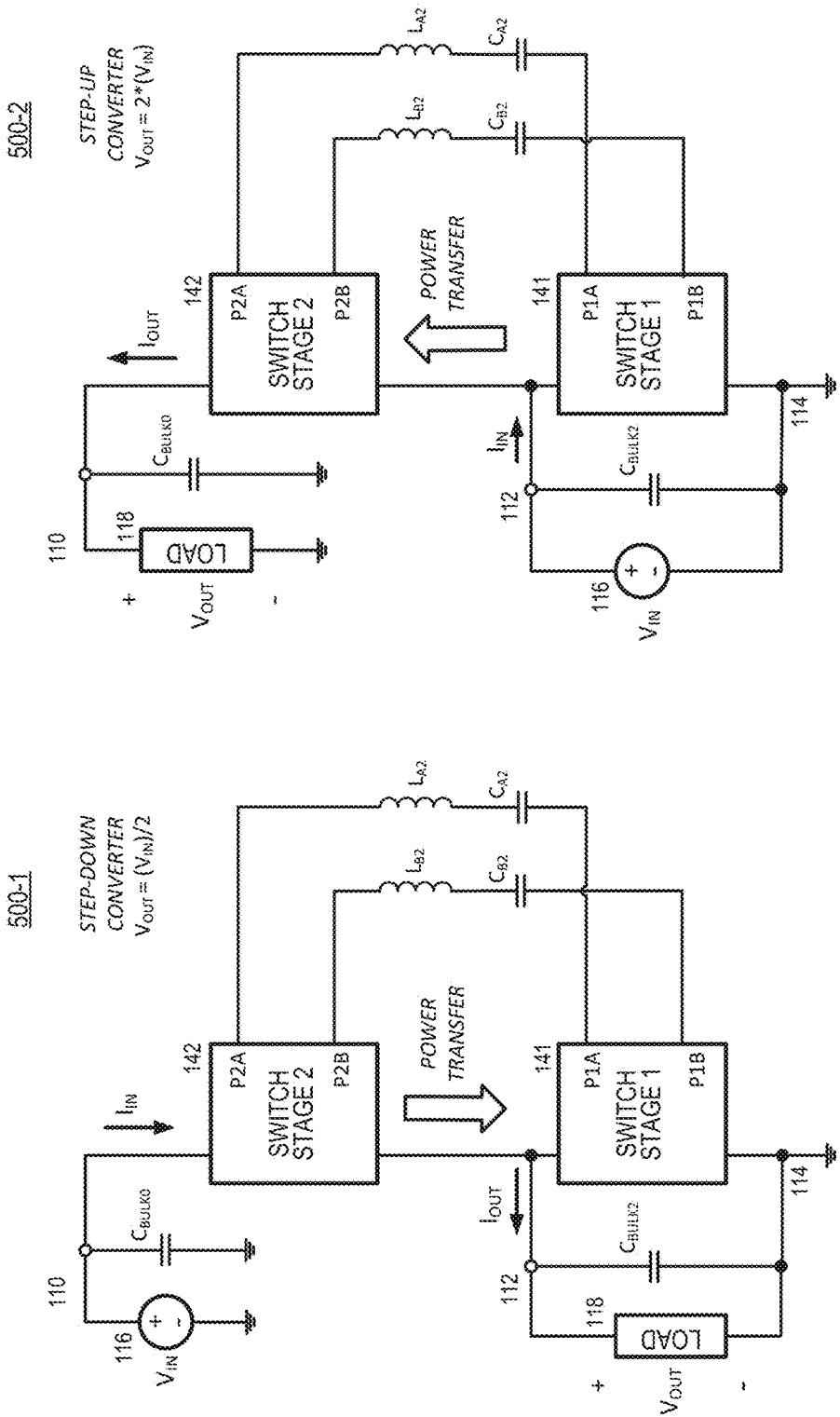
FIGS. 5A and 5B illustrate, respectively, step-down and step-up operational modes for a switched-capacitor converter, and associated input power supplies and loads which may be coupled to the switched-capacitor converter.

The SCC 100 is described above for scenarios in which it is operated to step down a voltage provided at an input. The circuitry for the SCC 100, and variations thereof, may also be used to step up a voltage. The switch control is substantially the same or similar for operation in a step-up mode as compared with the step-down mode, i.e., the controller 120 does not need to be changed for step-up operation of the SCC 100. When operated in a step-up mode, the first terminal 110 (having an associated high voltage) serves as an output from the SCC 100, whereas the second terminal 112 (having an associated low voltage) serves as an input. The distinctions between step-down and step-up operational modes are illustrated in FIGS. 5A and 5B. The SCC illustrated in these figures is similar to the SCC 100 of FIG. 1 but, for ease of illustration, several components of the SCC 100, e.g., the controller, the switch drivers, are not shown in FIGS. 5A and 5B.

FIG. 5A illustrates a 2:1 step-down voltage conversion system 500-1 including an SCC similar to that shown in FIG. 1. The first terminal 110 is coupled to an input power source 116 that provides an input voltage $V_{IN}$. The second terminal 112 supplies an output voltage $V_{OUT}$ to a load 118. Power is transferred from the first terminal 110 (input), through the switch stages 142, 141, and to the second terminal 112 (output). The input voltage $V_{IN}$ is stepped down by a factor of 2 to provide the output voltage $V_{OUT}$. Positive current $I_{IN}$ flows from the power source 116 to the second switch stage 142, and positive current $I_{OUT}$ flows from the second terminal 112 to the load 118 and a bulk capacitor $C_{BULK2}$, which serves as an output capacitor in this operational mode.

FIG. 5B illustrates a 1:2 step-up voltage conversion system 500-2. The circuitry of the SCC within the system 500-2 is the same as that within the system 500-1 illustrated in FIG. 5A, but the functions of the first and second terminals 110, 112 are swapped. The second terminal 112 is coupled to an input power source 116 that provides an input voltage $V_{IN}$. The first terminal 110 supplies an output voltage $V_{OUT}$ to a load 118. Power is transferred from the second terminal 112 (input), through the switch stages 142, 141, and to the first terminal 110 (output). The input voltage $V_{IN}$ is stepped up by a factor of 2 to provide the output voltage $V_{OUT}$. Positive current $I_{IN}$ flows from the power source 116 and the second terminal 112 to the switch stages 141, 142, and positive current $I_{OUT}$ flows from the first terminal 110 to the load 118 and a bulk capacitor $C_{BULK0}$, which serves as the output capacitor in this operational mode. Within the switch stages 141, 142 of the voltage conversion system 500-2, the power loops would be the same as those illustrated in FIGS. 3A and 3B, but the current directions would be reversed for this step-up operational mode.

The distinction between a load, such as the load 118, and a power source, such as the source 116, need not be persistent. For example, a battery operates as a power source when it is discharging, and operates as a load when it is being charged. Similarly, the SCC within of the systems 500-1, 500-2 need not be exclusively used as a step-up or step-down converter; the same converter may alternate operation between step-up and step-down modes i.e., be bi-directional.

Load-Dependent PWM Generation

As explained previously and as illustrated in the switch control signal $V_{PWM1}$, $V_{PWM2}$ waveforms 410, 420 of FIG. 4, the switches within the SCC 100 nearly always conduct. In particular, some switches are set to conduct during the first conduction interval $t_{ON1}$, and other switches are set to conduct during the second conduction interval $t_{ON2}$. Only during the dead-time intervals DT1, DT2 are none of the switches conducting. The dead-time intervals DT1, DT2 are relatively negligible, and are typically substantially smaller than the conduction intervals $t_{ON1}$, $t_{ON2}$. The switch control of the SCC 100 is relatively simple, in part, because the sequence of a first conduction interval $t_{ON1}$, a first dead-time interval DT1, a second conduction interval $t_{ON2}$, and a second dead-time interval is repeated for each switching cycle (switch period $T_{SW}$) while the SCC is operational. This contrasts with other types of voltage converters, e.g., regulated voltage converters, wherein the switch control depends upon measurements of output voltage or current and closed-loop control techniques that use such measurements.

When a load attached to the SCC 100 draws power between a maximum power transfer ability and a nominal power transfer of the SCC 100, the SCC operates with very high efficiency. For example, an SCC having a maximum power rating of 500 W that operates between 250 W (50% of maximum power) and 500 W (maximum power) may have a power transfer efficiency greater than 99%. Within this operational range, the relatively small power loss (<1%) is typically primarily caused by conduction (ohmic) losses through the switches and other components of the SCC; the power losses due to the switch drivers and the actual switching is negligible. (ZVS and ZCS mitigate the switching losses, but do not eliminate them.) However, at low power transfers, e.g., <10% of maximum power, the switching losses, including power loss within the switch drivers, are substantial and may dominate the total power loss of the SCC. This may be addressed by introducing idle periods substantially greater than the dead-time intervals DT1, DT2, thereby toggling the switches less often.

Figure 6A:
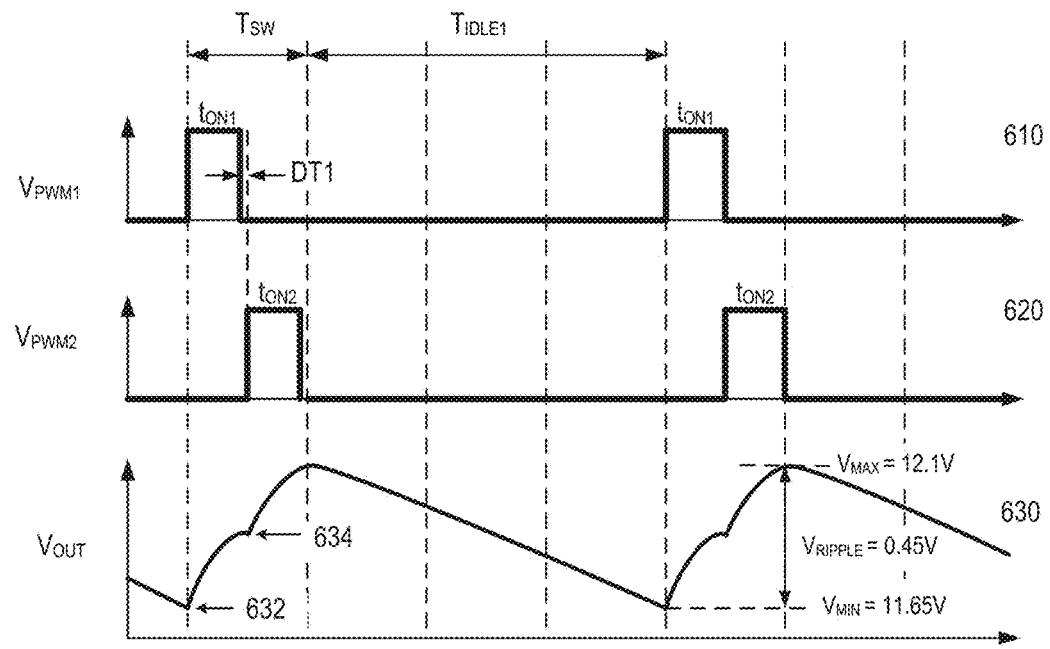
FIGS. 6A and 6B illustrate switch control signal timing and associated output voltage waveforms for a switched-capacitor converter using load-dependent signal generation.

FIG. 6A illustrates waveforms 610, 620 wherein idle periods $T_{IDLE1}$ are inserted between conduction interval pairs $t_{ON1}$, $t_{ON2}$ of the switch control signals $V_{PWM1}$, $V_{PWM2}$. Such switch control signals $V_{PWM1}$, $V_{PWM2}$ are advantageously used when an SCC is transferring relatively low power to its load. For example, consider an SCC and associated output (bulk) capacitor (e.g., $C_{BULK2}$ within FIG. 5A) that meet an output voltage ripple requirement $V_{MAX\_RIPPLE}=0.45V$ when operating at a maximum power rating of the SCC. When the SCC power transfer is only 25% of the maximum power rating, continuous pulsing of the switch control signals $V_{PWM1}$, $V_{PWM2}$ produces a much lower voltage ripple than is necessary. The controller 120 may instead introduce idle intervals, such as the illustrated $T_{IDLE1}$ interval, between conduction intervals of the generated switch control signals $V_{PWM1}$, $V_{PWM2}$, and still meet the voltage ripple requirements of the SCC. More particularly, the controller 120 may measure an output voltage and/or current, e.g., $V_{OUT}$ and/or $I_{OUT}$ as shown in FIG. 5A, and determine a power loading factor based upon the measurement(s). The power loading factor may then be used to determine if an idle interval $T_{IDLE1}$ should be inserted and, if so, how long the idle interval should be.

As illustrated in FIG. 6A, the idle interval $T_{IDLE1}$ is three switching periods long, i.e., $T_{IDLE1}=3*T_{SW}$. While the idle interval $T_{IDLE1}$ is not required to be a multiple of the switching period $T_{SW}$, this represents a preferred embodiment. Other embodiments may determine the idle interval $T_{IDLE1}$ without such a requirement, but any idle intervals $T_{IDLE1}$ should be substantially longer than the dead-time intervals DT1, DT2, and are typically at least longer than one switch period $T_{SW}$.

FIG. 6A also illustrates a waveform 630 for the output voltage $V_{OUT}$ resulting from the above described switch control. The output voltage $V_{OUT}$ is constrained within the required voltage ripple $V_{MAX\_RIPPLE}=0.45V$, even with the inserted idle intervals $T_{IDLE1}$. At the beginning 632 of the first conduction interval $t_{ON1}$, an output current Iour provided by the SCC 100 leads to an increase in the output voltage $V_{OUT}$. A minor glitch 634 in the voltage increase occurs during the dead time DT1 between the first and second conduction intervals $t_{ON1}$, $t_{ON2}$. Subsequently, the voltage $V_{OUT}$ continues to increase until it reaches a maximum value $V_{MAX}$. During the idle interval $T_{IDLE1}$, the voltage $V_{OUT}$ gradually decreases until it reaches a minimum value $V_{MIN}$.

Figure 6B:
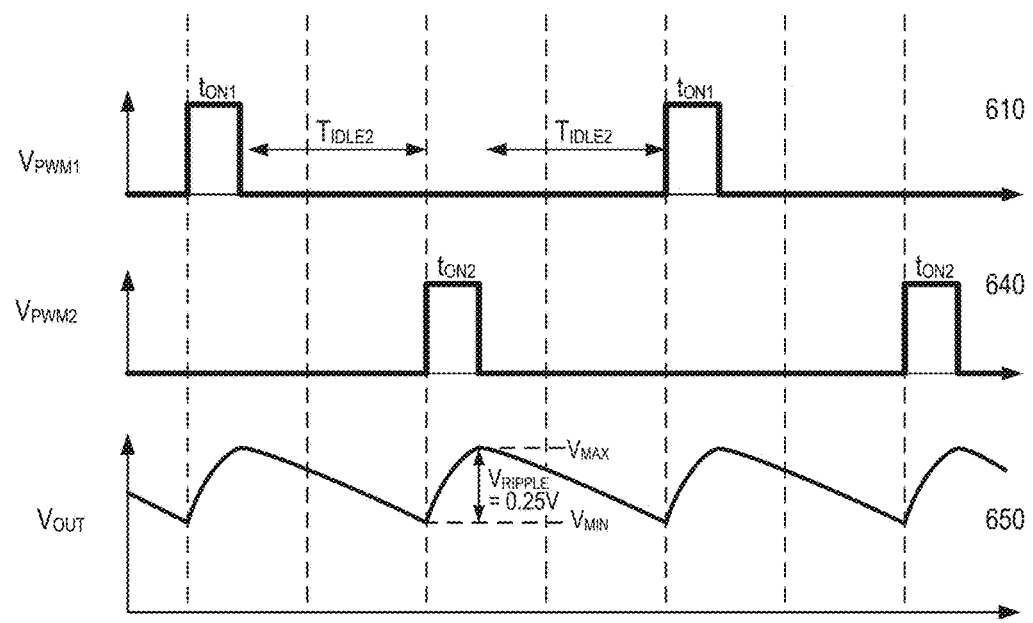

FIG. 6B illustrates waveforms 610, 640, 650 corresponding to an alternative technique for inserting an idle interval $T_{IDLE2}$. In this technique, the idle interval $T_{IDLE2}$ is inserted between the first conduction interval $t_{ON1}$ and the second conduction interval $t_{ON2}$ between the second conduction interval $t_{ON2}$ and the next first conduction interval $t_{ON1}$, etc. Current $I_{OUT}$ that is provided to the output is spread out more evenly, thereby reducing the voltage ripple $V_{RIPPLE}$, as shown. As illustrated, the idle interval $T_{IDLE2}$ is 150% of the switch period $T_{SW}$, but the length of the idle interval $T_{IDLE2}$ is not constrained thusly, and should, as explained above, be determined based upon a measured voltage $V_{OUT}$ and/or current $I_{OUT}$ at the SCC output. Note that there is a tradeoff between the idle interval $T_{IDLE2}$ length and the resultant voltage ripple $V_{RIPPLE}$, for a given power load factor. The illustrated idle interval $T_{IDLE2}$ length could be increased to approximately $3*T_{SW}$, while still meeting the described voltage ripple requirement $V_{MAX\_RIPPLE}=0.45V$. Such an increase in the idle interval $T_{IDLE2}$ length would decrease the switching losses, as compared to the scenario illustrated in FIG. 6B.

By introducing idle intervals between conduction intervals, as described above, switching losses (including switch drive losses) may be reduced for scenarios when the SCC 100 is lightly loaded. Preferably, the first and second conduction intervals $t_{ON1}$, $t_{ON2}$ used during the lightly-loaded scenarios when idle intervals are introduced are the same as the first and second conduction intervals $t_{ON1}$, $t_{ON2}$ used during normal operation. This allows the ZCS achieved during normal operational to also be achieved during the light-load operation.

Magnetic Power Transfer Between Switch Stages

Figure 7:
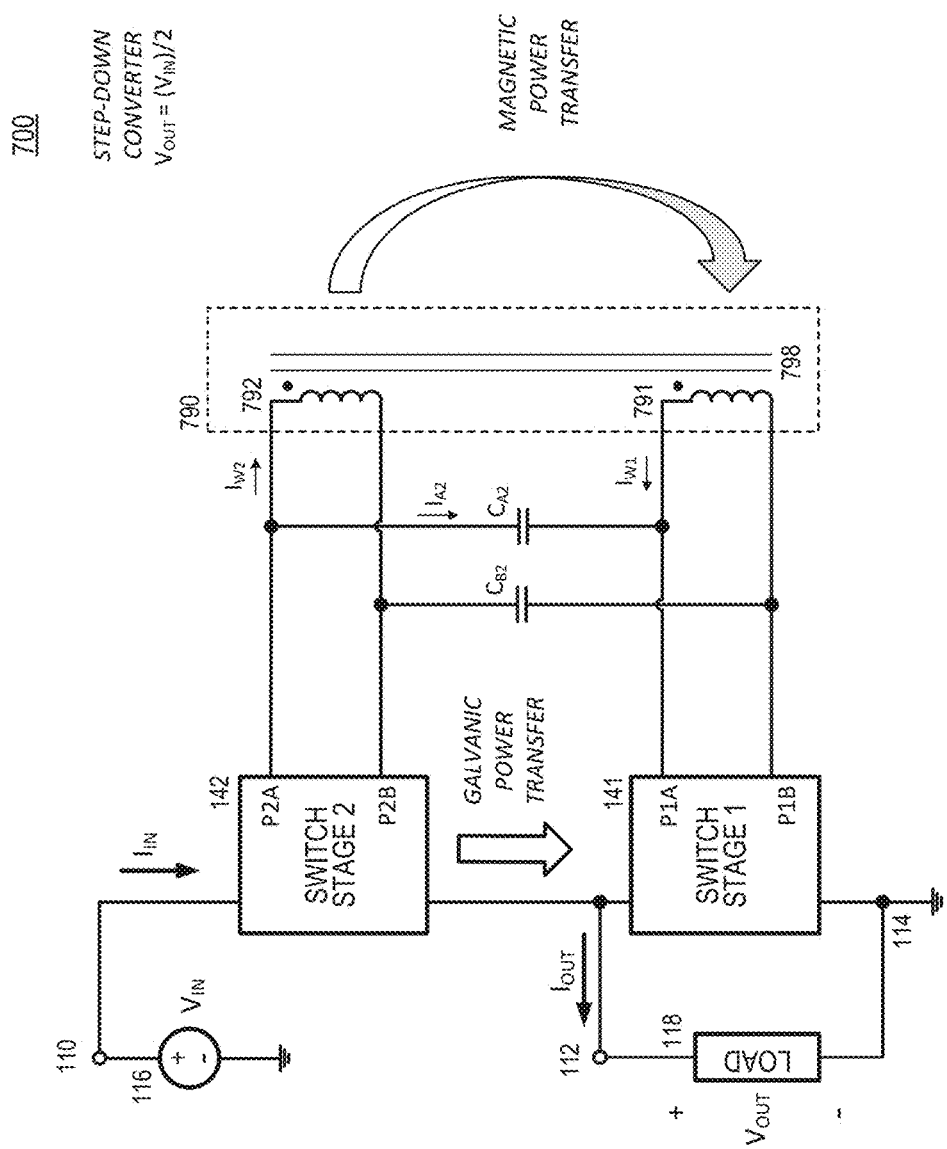
FIG. 7 illustrates a switched-capacitor converter similar to that of FIG. 1, but which also magnetically transfers power between the switch stages.

The previously-described embodiments focus on SCCs in which power is transferred electrically (galvanically) among the switch stages and the link capacitors. FIG. 7 illustrates an embodiment of an SCC similar to the SCC 100 of FIG. 1, but in which power is transferred magnetically between the switch stages 142, 141 using magnetic coupling elements 792, 791. The magnetic power transfer supplements, rather than replaces, the electrical power transfer described previously. By transferring a portion of the power magnetically, the electrical power transfer requirements are reduced, which may reduce the energy storage requirements of the link capacitors, and the capacitance/size of these capacitors.

FIG. 7 illustrates an SCC system 700 operating in a step-down mode. Such operation is similar to that described in relation to the SCC system 500-1 of FIG. 5A. The SCC within the SCC system 700 could also be operated in a step-up mode, using techniques similar to those described in relation to the SCC system 500-2 of FIG. 5B. For ease of description, only the step-down operational mode is considered below.

The SCC within FIG. 7 includes a first winding 791 coupled across the phase A and phase B switching nodes P1A, P1B of the first switch stage 141, and a second winding 792 coupled across corresponding switching nodes P2A, P2B of the second switch stage 142. The windings 791, 792 are part of a transformer 790, which also includes a core 798.

During a first conduction interval $t_{ON1}$, as described previously, current $I_{IN}$ flows from the power source 116 to the phase A switching node P2A. This input current is split into a portion $I_{A2}$, which charges the link capacitor $C_{A2}$, and a portion $I_{W2}$, which flows to the second winding 792. The (positive) current $I_{W2}$ flowing through the second winding 792 induces a current $I_{W1}$ flowing from the first winding 791. This current $I_{W1}$, flows to the phase A switching node P1A, which passes the current $I_{W1}$, to the output where it contributes to the output current $I_{OUT}$. Referring to the power loops of FIG. 3A, the current $I_{W1}$, from the first winding 791 contributes to the power loop 312 (current) at the switching node P1A. This additional current contribution $I_{W1}$ effectively reduces the current (e.g., $-I_{B2}$ as shown in FIG. 3A) that must be provided by the link capacitor $C_{B2}$ during the first conduction interval $t_{ON1}$, which corresponds to the discharge cycle of capacitor $C_{B2}$.

During a second conduction interval $t_{ON2}$, the windings 792, 791 similarly transfer power magnetically from the second switch stage 142 to the first switch stage 141. However, positive (winding) current flows from the phase B switching node P2B of the second switch stage to the second winding 792, and positive current flows from the first winding 791 to the phase B switching node P1B of the first switch stage 141. The magnetically-induced current from the first winding 791 flows through the switch Q1B_HS, and contributes to the output current $I_{OUT}$. Referring to the power loops of FIG. 3B, this current from the first winding 791 contributes to the power loop 322 (current) at the switching node PB1, and reduces the current (e.g., $-I_{A2}$ as shown in FIG. 3B) that must be provided by the discharge of the link capacitor $C_{A2}$ during the second conduction interval $t_{ON2}$.

As explained above, the magnetically-induced current within the first switch stage 141 contributes to the output current Iour that is provided during the discharge of the link capacitors $C_{A2}$, $C_{B2}$. For a given power transfer requirement of the SCC, this reduces the energy storage requirements of the link capacitors, meaning that their capacitance, and associated size, may be reduced relative to an SCC that does not use a magnetic power transfer, as described above.

The illustrated SCC system 700 does not show inductances in series with the link capacitors, as provided in the previously-described embodiments. The windings 791, 792 have associated magnetizing and leakage inductances, which effectively replace or supplement the inductances included in previous circuits. The winding magnetizing and leakage inductances, in combination with parasitic inductances and optional inductor components, may combine with the link capacitors to form resonant tanks, thereby leading to ZCS as similarly described previously.

Voltage Conversion Factors and Multiple Outputs

Figures 8A, 8B:
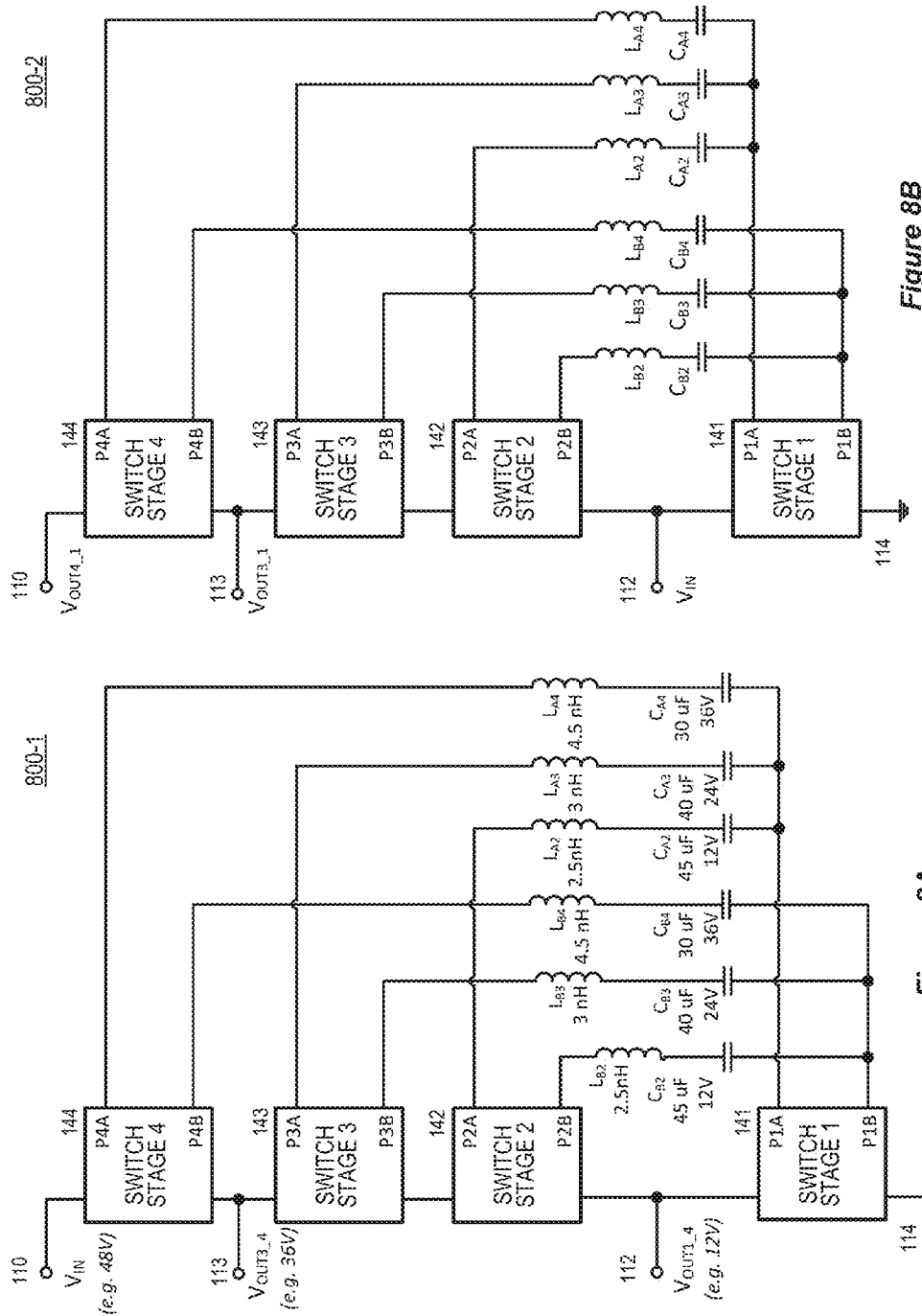
FIGS. 8A and 8B illustrate switched-capacitor converters having four switch stages and operating, respectively, in step-down and step-up modes.

The previously-described embodiments focus on SCCs having step-down ratios of 2:1 or step-up ratios of 1:2. However, SCCs according to the inventive techniques are not limited to these conversion factors, as such SCCs may generally support step-down and step-up ratios of N:M, wherein M and N are positive integers and neither is required to be one. For example, 5:3 step-down converters, 2:3 step-up converters, etc., may use the techniques described herein. Additionally, whereas the above SCC descriptions only reference first and second terminals for providing external electrical contact for input voltage sources and external loads, an SCC using the techniques herein may have additional external terminals. Embodiments of SCCs employing N:M step-down and step-up ratios, and embodiments having more than two external terminals, are illustrated in FIGS. 8A and 8B, and are described below. For ease of illustration, circuitry, e.g., a controller, drivers, that is the same as that described previously may not be replicated within FIGS. 8A and 8B.

FIG. 8A illustrates an SCC 800-1 having four switch stages 141, 142, 143, 144, and which is operating in a step-down mode. In this mode, the first terminal 110 is for coupling to an input power supply (not illustrated), which provides an input voltage $V_{IN}$, and the second terminal 112 is for providing an output voltage $V_{OUT1\_4}$ to a load (not illustrated). The voltage $V_{OUT1\_4}$ provided at the second terminal 112 is stepped down by a factor of four relative to the input voltage $V_{IN}$, i.e., the SCC 800-1 is operating as a 4:1 down-converter. In addition to the second terminal 112, a third terminal 113 taps a voltage between the fourth and third switch stages 144, 143. This third terminal 113 may supply power to another load (not illustrated) at an output voltage $V_{OUT3\_4}$ that is stepped down by 4:3 relative to the input voltage $V_{IN}$. Considering an example scenario in which the first terminal 110 is coupled to a 48V power source, the third terminal 113 would output a voltage of 36V that could be supplied to a load, and the second terminal 112 would output a voltage of 12V that could be supplied to another load.

FIG. 8B illustrates an SCC 800-2 having similar or the same circuitry as the SCC 800-1 of FIG. 8A, but which is operating in a step-up mode. In this mode, the second terminal 112 is for coupling to an input power supply (not illustrated), which provides an input voltage $V_{IN}$. The first and third terminals 110, 113 are for connecting to loads (not illustrated) of the SCC 800-2, and provide, respectively, output voltages $V_{OUT4\_1}$, $V_{OUT3\_1}$ that are stepped up, respectively, by 4 and 3 relative to the input voltage $V_{IN}$.

The link capacitors $C_{B2}$, $C_{B3}$, $C_{B4}$, $C_{A2}$, $C_{A3}$, $C_{A4}$ have varying capacitances, so as to provide a desired resonance $F_{RES}$ against the inductances $L_{B2}$, $L_{B3}$, $L_{B4}$, $L_{A2}$, $L_{A3}$, $L_{A4}$. The inductances within this embodiment are parasitic inductances. For example, the inductance $L_{A4}$ represents a sum of the parasitic inductance for the wiring/traces connecting the link capacitor $C_{A4}$ to the fourth switch stage 144 and to the first switch stage 141, as well as any parasitic inductance of the capacitor $C_{A4}$ and relevant switches or other circuit components through which the current $I_{A4}$ flows.

In a typical circuit, the first switch stage 141 will be physically close to the second switch stage 142, the third switch stage 143 will be slightly further away, and the fourth switch stage 144 will be still further away. The wiring/traces connecting the switching nodes P4A and P1A, via the link capacitor $C_{A4}$, will be longer and have larger parasitic wiring/trace inductance than the other connecting wiring/traces. In summary, the parasitic inductance $L_{A4} > L_{A3} > L_{A2}$. As illustrated, $L_{A4}=4.5$ nH, $L_{A3}=3$ nH, and $L_{A2}=2.5$ nH. The inductances for the connections between the phase B switching nodes is the same for this example, i.e., $L_{B4}=4.5$ nH, $L_{B3}=3$ nH, and $L_{B2}=2.5$ nH. Due to the varying inductances, a common capacitance for the link capacitors $C_{B2}$, $C_{B3}$, $C_{B4}$, $C_{A2}$, $C_{A3}$, $C_{A4}$ would lead to LC resonant tanks having different resonant frequencies. When using a common switching frequency $F_{SW}$ to control the switches within the SCC 800-1, the different resonant frequencies would cause the SCC 800-1 to lose its ZCS (or near ZCS) property, and to lose the low power losses associated with ZCS.

To address this potential problem, the capacitances are determined such that the inductance and capacitance of each connection yields a resonant frequency $F_{RES}$ close to the switching frequency $F_{SW}$ of the SCC 800-1. The resultant capacitances are provided in Table 1 for the circuits 800-1, 800-2 of FIGS. 8A and 8B. Note that the resonant frequency may be calculated according to $$F_{RES} = \frac{1}{2\pi\sqrt{LC}}.$$

TABLE 1

Inductances and capacitances for the switch stage connections

| Inductance | Link Capacitance | Resonant Frequency |
|---|---|---|
| $L_{A2} = 2.5$ nH | $C_{A2} = 45$ μF | $F_{A2} = 475$ Hz |
| $L_{A3} = 3.0$ nH | $C_{A3} = 40$ μF | $F_{A3} = 459$ Hz |
| $L_{A4} = 4.5$ nH | $C_{A4} = 30$ μF | $F_{A4} = 433$ Hz |

The above capacitances are chosen from standard capacitance values, and do not yield resonant frequencies identical to each other. For a switching frequency $F_{SW}$ of approximately 450 kHz, the resonant frequency for each LC resonant tank is reasonably close, meaning that near ZCS may be achieved.

For the illustrated SCC 800-1, the voltage across the switching nodes from the first and second switch stages 141, 142 is expected to be 12V, whereas the corresponding voltage across the first and third switch stages 131, 143 is expected to be 24V, etc. The voltage rating of the capacitors may, hence, be varied as shown in FIG. 8A, i.e., the link capacitors $C_2$, $C_{A3}$, $C_{A4}$ have voltage ratings of, respectively, 12V, 24V, and 36V. The physical size of a capacitor, for a given technology (material), is determined by its capacitance and its voltage rating. By reducing the voltage rating for the high-capacitance capacitors, the link capacitors $C_{A2}$, $C_{A3}$, $C_{A4}$ may have a similar physical size, which can provide layout advantages.

Additional Half Bridges within Each Switch Stage

Figure 11:
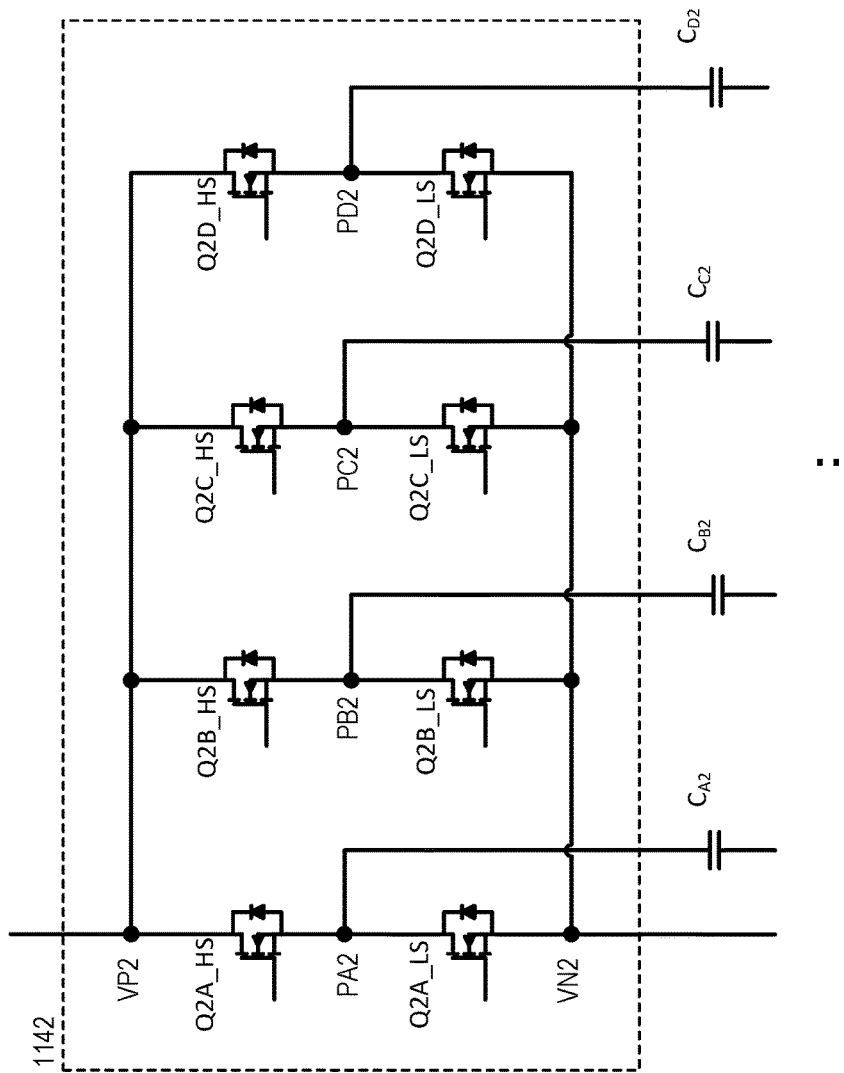
FIG. 11 illustrates a switch stage having four half bridges connected in parallel.

The switch stages are described above as having two half bridges connected in parallel. Additional half bridges may be included within each switch stage. In one embodiment, these additional half bridges are controlled in the same manner as the phase A and phase B half bridges described previously. The additional half bridges may serve to increase the current capacity (power capacity) through the switch stage, or may reduce ohmic conduction losses through the switch stage. FIG. 11 illustrates a switch stage 1142 having two such additional half bridges. This switch stage 1142 is similar to the second switch stage 142 of, e.g., FIGS. 1, 3A, 3B, 8A, 8B, and 10, except that the switch stage 1142 includes phase C and phase D half stages which are connected in parallel to the phase A and phase B half bridges.

In preferred embodiments that use additional parallel half bridges within a switch stage, the controller 120 is modified to generate third and fourth switch control signals for driving the switches within a phase C and a phase D half bridge. The third and fourth switch control signals are delayed versions of the first and second switch control signals. The third and fourth switch control signals include third and fourth conduction intervals. The third conduction interval will partially overlap with the first and second conduction interval, and the fourth conduction interval will partially overlap with the first and second conduction intervals. However, the third and fourth conduction intervals do not overlap with each other.

By staggering the switch timing of the additional half bridges, the output current Iour may be made even smoother than it is in the circuit topologies relying upon switch stages with two half bridges.

Method for Voltage Conversion Using Interleaved Half Bridges

Figure 9:
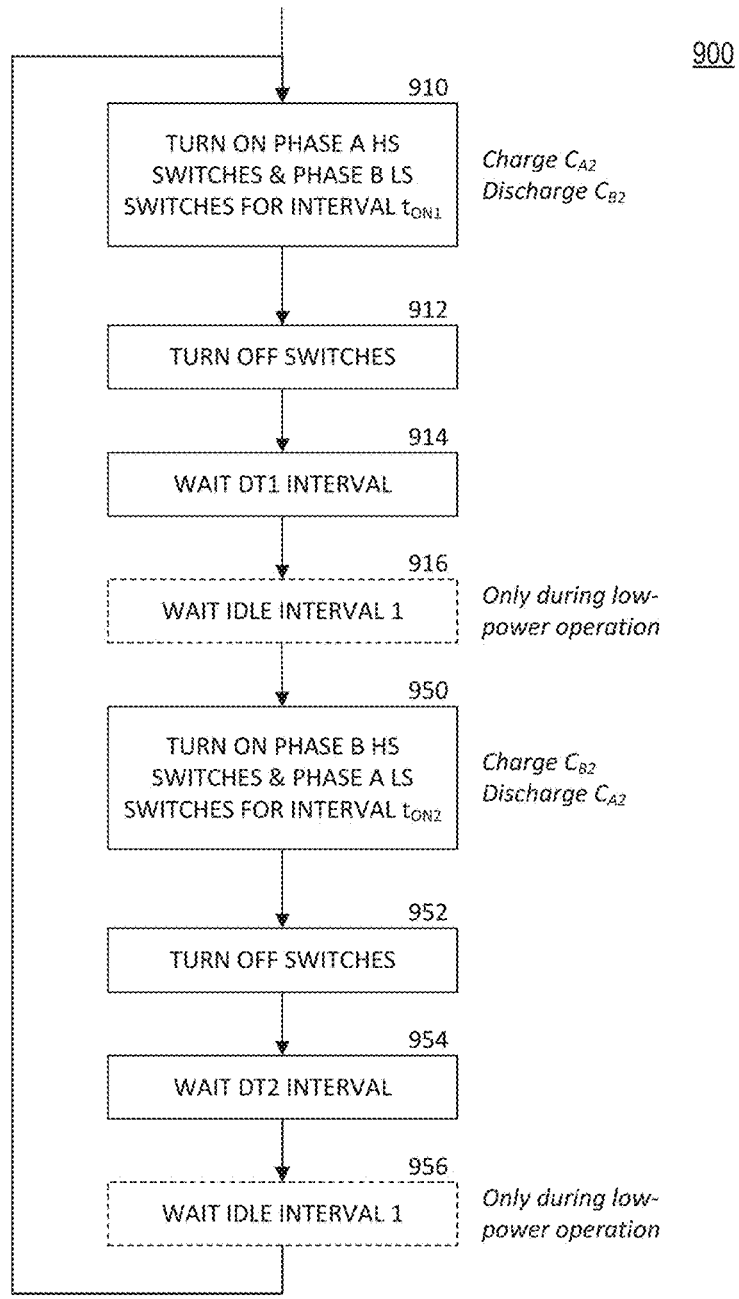
FIG. 9 illustrates a method, within a switched capacitor converter, for using interleaved half bridges to transfer power among switch stages.

FIG. 9 illustrates a method 900 for converting an input voltage provided at a first terminal of a voltage converter into an output voltage provided at a second terminal. This method may be implemented within a switched-capacitor converter (SCC), such as the SCC 100 illustrated in FIG. 1. The voltage conversion techniques of this method 900 utilize interleaved control of half bridges to transfer power through the SCC.

The method 900 begins with a step 910 of turning on high-side (HS) switches within a phase A half bridge of each switch stage, and low-side (LS) switches within a phase B half bridge of each switch stage. This state is held for a first conduction interval $t_{ON1}$, during which a first link capacitor $C_{A2}$ is charged and a second link capacitor $C_{B2}$ is discharged.

The $C_{B2}$ discharging supplies current $I_{OUT}$ to an output of the SCC. The switches are then turned off 912, and the switches are held off 914 for a dead time interval DT1. In an optional step 916, the SCC load power draw may be measured and, if this power is low, the switches may be held off for an additional idle interval that is based upon the drawn power (e.g., output current $I_{OUT}$).

The method 900 continues by turning on the opposite switches within each of the switch stages, i.e., turning on 950 high-side (HS) switches within the phase B half bridge of each switch stage, and low-side (LS) switches within the phase A half bridge of each switch stage. This state is held for a second conduction interval $t_{ON2}$, during which the first link capacitor $C_{A2}$ is discharged and the second link capacitor $C_{B2}$ is charged. The $C_{A2}$ discharging supplies current $I_{OUT}$ to an output of the SCC. The switches are then turned off 952, and the switches are held off 954 for a dead time interval DT2. In an optional step 956, the switches may be held off for an additional idle interval that is based upon the measured drawn power of the load (e.g., output current Iour).

The above steps beginning at step 910 are repeated indefinitely while the SCC is operating.

As used herein, the terms "having," "containing," "including," "comprising," and the like are open-ended terms that indicate the presence of stated elements or features, but do not preclude additional elements or features. The articles "a," "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A switched-capacitor converter, comprising:
    an input;
    at least two switch stages in a cascade arrangement, wherein at least a first and a second of the switch stages each comprise:
        a first half bridge which includes a first high-side switch and a first low-side switch connected in series at a first switching node; and
        a second half bridge which includes a second high-side switch and a second low-side switch connected in series at a second switching node,
        wherein the first and second half bridges are connected in parallel;
    a first capacitor that couples the first switching node of the first switch stage to the first switching node of the second switch stage, and which provides a nonzero average voltage difference between the first switching node of the first switch stage and the first switching node of the second switch stage;
    a second capacitor that couples the second switching node of the first switch stage to the second switching node of the second switch stage, and which provides a nonzero average voltage difference between the second switching node of the first switch stage and the second switching node of the second switch stage;

an output for providing direct-current (DC) power to a load, wherein the output is electrically connected to the first and/or the second switch stages; and a controller operable to generate:
  a first switch control signal that controls the first high-side switch for each of the first and second switch stages, and
  a second switch control signal that controls the second high-side switch for each of the first and second switch stages, wherein the input and the output are electrically connected through the first and/or the second switch stages, and wherein the at least two switch stages are electrically connected in series between the input or the output and a ground.

2. The switched-capacitor converter of claim 1,
wherein the first switch control signal also controls the second low-side switch for each of the first and second switch stages, and
wherein the second switch control signal also controls the first low-side switch for each of the first and second switch stages, and
wherein the first and second switch control signals alternately provide active levels, such that the first high-side switch and the second low-side switch of each of the first and second switch stages are turned on for a first conduction interval, and the first low-side switch and the second high-side switch of each of the first and second switch stages are turned on for a second conduction interval, wherein the first and second conduction intervals do not overlap.

3. The switched-capacitor converter of claim 1,
wherein the first and second switch stages each further comprise a third half-bridge which includes a third high-side switch and a third low-side switch connected in series at a third switching node, the third half bridge being connected in parallel with the first and second half bridges, and
wherein the switched capacitor converter further comprises a third capacitor that couples the third switching node of the first switch stage to the third switching node of the second switch stage.

4. The switched-capacitor converter of claim 1, further comprising:
a first resonant inductor connected in series with the first capacitor.

5. The switched-capacitor converter of claim 1:
wherein a first resonant inductance between the first switching node of the first switch stage and the first switching node of the second switch stage is determined;
wherein a switching frequency, or a pulse width, or both, of the generated first and second switch control signals is determined based upon the first resonant inductance and a first capacitance of the first capacitor, so as to achieve zero current switching (ZCS), or near ZCS, for at least one of the first high-side switch and the first low-side switch of the first switch stage.

6. The switched-capacitor converter of claim 1, further comprising:
a first magnetic coupling element connected to the first switch stage; and
a second magnetic coupling element connected to the second switch stage,
wherein energy is transferred between the first switch stage and the second switch stage via the first and second magnetic coupling elements.

7. The switched-capacitor converter of claim 1, wherein the controller is further configured to:
input a measured current or voltage or both corresponding to the output;
detect that the measured current or voltage is below a threshold;
responsive to said detection, enter a low-power operational mode, wherein the first and second switch control signals are modified such that idle intervals, lasting longer than an active pulse interval of the first or second switch control signals for a normal operational mode, are inserted between active pulses of at least one of the first and second switch control signals.

8. The switched-capacitor converter of claim 7, wherein a length of each of the idle intervals is based upon the measured current or voltage or both.

9. The switched-capacitor converter of claim 7, wherein an active pulse interval for the low-power operational mode is the same as the active pulse interval for the normal operational mode.

10. The switched-capacitor converter of claim 7, wherein the controller is further configured such that the first and second switch control signals are generated during the low-power operational mode by:
setting the first switch control signal to an active level for the active pulse interval, such that the first high-side switch and the second low-side switch of each of the first and second switch stages conduct for the active pulse interval;
subsequently, setting the first and second switch control signals to an inactive level for an idle interval, wherein the idle interval is longer than a dead-time interval inserted between the active pulses during the normal operational mode;
subsequently, setting the second switch control signal to the active level for the active pulse interval, such that the first low-side switch and the second high-side switch of each of the first and second switch stages conduct for the active pulse interval; and
subsequently, setting the first and second switch control signals to the inactive level for the idle interval.

11. The switched-capacitor converter of claim 1, wherein the switched-capacitor converter is configured to convert an input voltage into an output voltage, wherein the output voltage is the input voltage multiplied by M and divided by N, where M and N are each positive integers.

12. The switched-capacitor converter of claim 11,
wherein M is equal to 1 and N is greater than or equal to 2, resulting in a step-down conversion ratio of the voltage converter of N to 1, or
wherein N is equal to 1 and M is greater than or equal to 2, resulting in a step-up conversion ratio of the voltage converter of 1 to M.

13. The switched-capacitor converter of claim 1, further comprising:
a switch driver for each of the switches within the first and the second switch stages, wherein at least one of the switch drivers is a bootstrap switch driver which comprises a linking capacitor.

14. The switched-capacitor converter of claim 1,
comprising a first terminal corresponding to a high voltage, and a second terminal corresponding to a low voltage, wherein the switched-capacitor converter operates in a step-down mode for a first operational interval, during which the first terminal is the input and the second terminal is the output, and wherein the switched-capacitor converter operates in a step-up mode for a second operational interval, during which the second terminal is the input, and the first terminal is the output.

15. The switched-capacitor converter of claim 1, wherein the at least two switch stages comprises four switch stages and the switched-capacitor converter is a four-to-one step down converter.

16. An electrical system, comprising:
a switched-capacitor converter that comprises:
an input;
at least two switch stages in a cascade arrangement, wherein at least a first and a second of the switch stages each comprise:
a first half bridge which includes a first high-side switch and a first low-side switch connected in series at a first switching node; and
a second half bridge which includes a second high-side switch and a second low-side switch connected in series at a second switching node,
wherein the first and second half bridges are connected in parallel;
a first capacitor that couples the first switching node of the first switch stage to the first switching node of the second switch stage, and which provides a nonzero average voltage difference between the first switching node of the first switch stage and the first switching node of the second switch stage;
a second capacitor that couples the second switching node of the first switch stage to the second switching node of the second switch stage, and which provides a nonzero average voltage difference between the second switching node of the first switch stage and the second switching node of the second switch stage;
an output for providing direct-current (DC) power, wherein the output is electrically connected to the first and/or the second switch stages; and
a controller operable to generate:
a first switch control signal that controls the first high-side switch for each of the first and second switch stages, and
a second switch control signal that controls the second high-side switch for each of the first and second switch stages,
wherein the input and the output are electrically connected through the first and/or the second switch stages,
wherein the at least two switch stages are electrically connected in series between the input or the output and a around; and a load that is electrically coupled to the output and that is provided with DC power by the switched-capacitor converter.

17. A method for converting voltage levels within a switched-capacitor converter (SCC), the SCC comprising an input; at least two switch stages coupled together in a cascade arrangement, wherein at least a first and a second of the switch stages each comprise a first half bridge which includes a first high-side switch and a first low-side switch connected in series at a first switching node, and a second half bridge which includes a second high-side switch and a second low-side switch connected in series at a second switching node, wherein the first and second half bridges are connected in parallel; a first capacitor that couples the first switching nodes of the first and second switch stages together; a second capacitor that couples the second switching nodes of the first and second switch stages together; an output for providing direct-current (DC) power to a load, wherein the at least two switch stages are electrically connected in series between the input or the output and a ground, wherein the output is electrically connected to the first and/or the second switch stages and wherein the output is electrically connected to the input through the first and/or second switch stages, the method comprising:
turn on the first high-side switches and the second low-side switches of the each of the switch stages for a first conduction interval, so as to charge the first capacitor and discharge the second capacitor;
turn off all of the switches of the at least two switch stages for a first dead-time interval following the first conduction interval;
turn on the first low-side switches and the second high-side switches of the each of the switch stages for a second conduction interval, so as to charge the second capacitor and discharge the first capacitor; and
turn off all of the switches of the at least two switch stages for a second dead-time interval following the first conduction interval,
such that a nonzero average voltage difference is provided between the first switching node of the first switch stage and the first switching node of the second switch stage by the first capacitor, and
such that a nonzero average voltage difference is provided between the second switching node of the first switch stage and the second switching node of the second switch stage by the second capacitor.

18. The method of claim 17, further comprising:
measuring a current or voltage or both at the output;
detecting that the measured current or voltage is below a threshold;
responsive to said detecting, determining an idle interval based upon the measured current or voltage or both, wherein the idle interval is longer than either of the first and the second conduction intervals; and
setting at least one of the first and the second dead-time intervals to the idle interval.

* * * * *

UNITED STATES PATENT AND TRADEMARK OFFICE
CERTIFICATE OF CORRECTION

PATENT NO. : 10,256,729 B1  
APPLICATION NO. : 15/913363  
DATED : April 9, 2019  
INVENTOR(S) : C. Notsch Page 1 of 1

It is certified that error appears in the above-identified patent and that said Letters Patent is hereby corrected as shown below:

On the Title Page

Title (Line 2), please change "BRIDGE" to -- BRIDGES --.

Signed and Sealed this  
Second Day of July, 2019

Andrei Iancu  
*Director of the United States Patent and Trademark Office*